US006037717A

United States Patent [19]

Maishev et al.

[11] Patent Number: 6,037,717

[45] Date of Patent: Mar. 14, 2000

[54] COLD-CATHODE ION SOURCE WITH A CONTROLLED POSITION OF ION BEAM

[75] Inventors: Yuri Maishev, Moscow, Russian Federation; James Ritter, Fremont, Calif.; Leonid Velikov; Alexander Shkolnik, both of San Carlos, Calif.

[73] Assignee: Advanced Ion Technology, Inc., Fremont, Calif.

[21] Appl. No.: 09/225,159

[22] Filed: Jan. 4, 1999

[51] Int. Cl.[7] .......... H01J 37/08

[52] U.S. Cl. .......... 315/111.91; 315/111.41; 250/423 R; 204/298.16

[58] Field of Search .......... 315/111.21, 111.41, 315/111.81, 111.91; 204/298.02, 298.16; 250/423 R, 426, 423 F

[56] References Cited

U.S. PATENT DOCUMENTS

| | | | |
|---|---|---|---|
| 4,094,764 | 6/1978 | Boucher et al. | 204/298.16 |
| 4,122,347 | 10/1978 | Kovalsky et al. | 250/423 R |
| 4,710,283 | 12/1987 | Singh et al. | 250/423 R |

FOREIGN PATENT DOCUMENTS

| | | |
|---|---|---|
| 2030807 | 3/1995 | Russian Federation . |

OTHER PUBLICATIONS

Kaufman H.R, et al. (End Hall Ion Source, J. Var. Sci, Technology vol. 5, Jul./Aug., 1987, pp. 2081–2084).

U.S. application No. 09/161,581, Maishev et al., filed Apr. 1998.

*Primary Examiner*—Justin P. Bettendorf

[57] ABSTRACT

A cold-cathode ion source with a closed-loop ion-emitting slit which is provided with means for generating a cyclically-variable, e.g., alternating or pulsating electric or magnetic field in an anode-cathode space. These means may be made in the form of an alternating-voltage generator which generates alternating voltage on one of the cathode parts that form the ion-emitting slit, whereas the other slit-forming part is grounded. The alternating voltage deviates the ion beam in the slit with the same frequency of the alternating voltage. In accordance with another embodiment, the aforementioned means may be an electromagnetic coil which generates a magnetic field which passes through the ion-emitting slit, thus acting on the condition of the spatial-charge formation and, hence, on concentration of ions in the ion beam. The cold-cathode ion source may be of any type, i.e., with the ion beam emitted in the direction perpendicular to the direction of drift of electrons in the ion-emitting slit or with the direction of emission of the beam which coincides with the direction of electron drift.

28 Claims, 16 Drawing Sheets

COLD-CATHODE ION SOURCE WITH A CONTROLLED POSITION OF ION BEAM

FIELD OF THE INVENTION

The present invention relates to ion-emission technique, particularly to cold-cathode ion sources used for treating internal or external surfaces of objects with a controlled position of the ion beam. More specifically, the invention relates to cold-cathode ion sources with closed-loop ion-emitting slits, in particular to a method and an apparatus for improving uniformity in ion beam density on the surfaces of treated objects and for varying the positions of ion beams with respect to the objects being treated.

BACKGROUND OF THE INVENTION AND DESCRIPTION OF THE PRIOR ART

An ion source is a device that ionizes gas molecules and then focuses, accelerates, and emits them as a narrow beam. This beam is then used for various technical and technological purposes such as cleaning, activation, polishing, thin-film coating, or etching.

An example of an ion source is the so-called Kaufman ion source, also known as a Kaufman ion engine or an electron-bombardment ion source described in U.S. Pat. No. 4,684,848 issued to H. R. Kaufman in 1987.

This ion source consists of a discharge chamber, in which plasma is formed, and an ion-optical system, which generates and accelerates an ion beam to an appropriate level of energy. A working medium is supplied to the discharge chamber, which contains a hot cathode that functions as a source of electrons and is used for firing and maintaining a gas discharge. The plasma, which is formed in the discharge chamber, acts as an emitter of ions and creates, in the vicinity of the ion-optical system, an ion-emitting surface. As a result, the ion-optical system extracts ions from the aforementioned ion-emitting surface, accelerates them to a required energy level, and forms an ion beam of a required configuration. Typically, aforementioned ion sources utilize two-grid or three-grid ion-optical systems.

A disadvantage of such a device is that it requires the use of ion accelerating grids and that it produces an ion beam of low intensity.

Attempts have been made to provide ion sources with ion beams of higher intensity by holding the electrons in a closed space between a cathode and an anode where the electrons could be held. For example, U.S. Pat. No. 4,122,347 issued in 1978 to Kovalsky, et al. describes an ion source with a closed-loop trajectory of electrons for ion-beam etching and deposition of thin films, wherein the ions are taken from the boundaries of a plasma formed in a gas-discharge chamber with a hot cathode. The ion beam is intensified by a flow of electrons which are held in crossed electrical and magnetic fields within the accelerating space and which compensate for the positive spatial charge of the ion beam.

A disadvantage of the devices of such type is that they do not allow formation of ion beams of chemically-active substances when these ion beams are used for treating large surface areas. Other disadvantages of the aforementioned devices are short service life and high non-uniformity of ion beams.

U.S. Pat. No. 4,710,283 issued in 1997 to Singh, et al. describes a cold-cathode type ion source with crossed electric and magnetic fields for ionization of a working substance wherein entrapment of electrons and generation of the ion beam are performed with the use of a grid-like electrode. This source is advantageous in that it forms belt-like and tubular ion beams emitted in one or two opposite directions.

The ion source with a grid-like electrode of the type disclosed in U.S. Pat. No. 4,710,283 also has a number of disadvantages consisting in that the grid-like electrode makes it difficult to produce an extended ion beam and in that the ion beam is additionally contaminated as a result of sputtering of the material from the surface of the grid-like electrode. Furthermore, with the lapse of time the grid-like electrode is deformed whereby the service life of the ion source as a whole is shortened.

Other publications (e.g., Kaufman H. R., et al. (End Hall Ion Source, J. Vac. Sci. Technol., Vol. 5, Jul./Aug., 1987, pp. 2081–2084; Wyckoff C. A., et al., 50-cm Linear Gridless Source, Eighth International Vacuum Web Coating Conference, Nov. 6–8, 1994)) disclose an ion source that forms conical or belt-like ion beams in crossed electrical and magnetic fields. The device consists of a cathode, a hollow anode with a conical opening, a system for the supply of a working gas, a magnetic system, a source of electric supply, and a source of electrons with a hot cathode. A disadvantage of this device is that it requires the use of a source of electrons with a hot or hollow cathode and that it has electrons of low energy level in the zone of ionization of the working substance. These features create limitations for using chemically-active working substances. Furthermore, a ratio of the ion-emitting slit width to a cathode-anode distance is significantly greater than 1, and this decreases the energy of electrons in the charge space, and hence, hinders ionization of the working substance. Configuration of the electrodes used in the ion beam of such sources leads to a significant divergence of the ion beam. As a result, the electron beam cannot be delivered to a distant object and is to a greater degree subject to contamination with the material of the electrode. In other words, the device described in the aforementioned literature is extremely limited in its capacity to create an extended uniform belt-like ion beam. For example, at a distance of 36 cm from the point of emission, the beam uniformity did not exceed ±7%.

Russian Patent No. 2,030,807 issued in 1995 to M. Parfenyonok, et al. describes an ion source that comprises a magnetoconductive housing used as a cathode having an ion-emitting slit, an anode arranged in the housing symmetrically with respect to the emitting slit, a magnetomotance source, a working gas supply system, and a source of electric power supply.

FIGS. 1 and 2 schematically illustrate the aforementioned known ion source with a circular ion-beam emitting slit. More specifically, FIG. 1 is a sectional side view of an ion-beam source with a circular ion-beam emitting slit, and FIG. 2 is a sectional plan view along line II—II of FIG. 1.

The ion source of FIGS. 1 and 2 has a hollow cylindrical housing 40 made of a magnetoconductive material such as Armco steel (a type of a mild steel), which is used as a cathode. Cathode 40 has a cylindrical side wall 42, a closed flat bottom 44 and a flat top side 46 with a circular ion emitting slit 52.

A working gas supply hole 53 is formed in flat bottom 44. Flat top side 46 functions as an accelerating electrode. A magnetic system in the form of a cylindrical permanent magnet 66 with poles N and S of opposite polarity is placed inside the interior of hollow cylindrical housing 40 between bottom 44 and top side 46. An N-pole faces flat top side 46, and S-pole faces bottom side 44 of the ion source. The purpose of magnetic system 66 with a closed magnetic circuit formed by parts 66, 40, 42, and 44 is to induce a magnetic field in ion emitting slit 52. It is understood that this magnetic system is shown only as an example and that it can be formed in a manner described, e.g., in aforementioned U.S. Pat. No. 4,122,347. A circular annular-shaped anode 54, which is connected to a positive pole 56*a* of an electric power source 56, is arranged in the interior of housing 40 around magnet 66 and concentric thereto. Anode 54 is fixed inside housing 40 by means of a ring 48 made of a non-magnetic dielectric material such as ceramic. Anode 54 has a central opening 55 in which aforementioned permanent magnet 66 is installed with a gap between the outer surface of the magnet and the inner wall of opening 55. A negative pole 56*b* of the electric power source is connected to housing 40, which is grounded at GR.

Located above housing 40 of the ion source of FIGS. 1 and 2 is a sealed vacuum chamber 57 which has an evacuation port 59 connected to a source of vacuum (not shown). An object OB to be treated is supported within chamber 57 above ion emitting slit 52, e.g., by gluing it to an insulator block 61 rigidly attached to the housing of vacuum chamber 57 by a bolt 63 but so that object OB remains electrically and magnetically isolated from the housing of vacuum chamber 57. However, object OB is electrically connected via a line 56*c* to negative pole 56*b* of power source 56. Since the interior of housing 40 communicates with the interior of vacuum chamber 57, all lines that electrically connect power source 56 with anode 54 and object OB should pass into the interior of housing 40 and vacuum chamber 57 via conventional commercially-produced electrical feedthrough devices which allow electrical connections with parts and mechanisms of sealed chambers without violation of their sealing conditions. In FIG. 1, these feedthrough devices are shown schematically and designated by reference numerals 40*a* and 57*a*. Reference numeral 57*b* designates a seal for sealing connection of vacuum chamber 57 to housing 40.

The known ion source of the type shown in FIGS. 1 and 2 is intended for the formation of a unilaterally directed tubular ion beam. The source of FIGS. 1 and 2 forms a tubular ion beam IB emitted in the direction of arrow A and operates as follows.

Vacuum chamber 57 is evacuated, and a working gas is fed into the interior of housing 40 of the ion source. A magnetic field is generated by magnet 66 in an ion-accelerating space 52*a* between anode 54 and cathode 40, whereby electrons begin to drift in a closed path within the crossed electrical and magnetic fields. A plasma 58 is formed between anode 54 and cathode 40. When the working gas is passed through the ionization space, tubular ion beam IB, which propagates in the axial direction of the ion source shown by an arrow A, is formed in the area of ion-emitting slit 52 and in ion-accelerating space 52*a* between anode 54 and cathode 40.

The above description of the electron drift is simplified to ease understanding of the principle of the invention. In reality, the phenomenon of generation of ions in the ion source with a closed-loop drift of electrons in crossed electric and magnetic fields is of a more complicated nature and consists in the following.

When, at starting the ion source, a voltage between anode 54 and cathode 40 reaches a predetermined level, a gas discharge occurs in anode-cathode space 52*a*. Inside the ion-emitting slit, the crossed electric and magnetic fields force the electrons to move along closed cycloid trajectories. This phenomenon is known as "magnetization" of electrons. The magnetized electrons remain drifting in a closed space between two parts of the cathode, i.e., between those facing parts of cathode 40 which form ion-emitting slit 52. The radius of the cycloids is, in fact, the so-called doubled Larmor radius $R_L$ which is represented by the following formula:

$$R_L = meV/|e|B,$$

where m is a mass of the electron, B is the strength of the magnetic field inside the slit, V is a velocity of the electrons in the direction perpendicular to the direction of the magnetic field, and lel is the charge of the electron. In electromagnetism, the Larmor radius is known as the radius along which a charged particle moves in a uniform magnetic field, which causes its travel in a circular path in a plane perpendicular to the magnetic field.

It is required that the height of the electron drifting space in the ion-emission direction be much greater than the aforementioned Larmor radius. This means that a part of the ionization area penetrates ion-emitting slit 52 where electrons can be maintained in a drifting state over a long period of time. In other words, a spatial charge of high density is formed in ion-emitting slit 52.

When a working medium, such as argon which has neutral molecules, is injected into the slit, the molecules are ionized by the electrons present in this slit and are accelerated by the electric field. As a result, the thus formed ions are emitted from the slit towards the object. Since the spatial charge has high density, an ion beam of high density is formed.

Thus, the electrons do not drift in a plane, but rather along cycloid trajectories across ion-emitting slit 52. However, for the sake of convenience of description, here and hereinafter and in the claims, the term "electron drifting plane" will be used.

The diameter of the tubular ion beam formed by means of such an ion source may reach 500 mm and more.

The ion source of the type shown in FIG. 1 is not limited to a cylindrical configuration and may have an elliptical or an oval-shaped cross section as shown in FIG. 3. In FIG. 3 the parts of the ion beam source that correspond to similar parts of the previous embodiment are designated by the same reference numerals with an addition of subscript OV. Structurally, this ion source is the same as the one shown in FIG. 1 with the exception that a cathode $\mathbf{40}_{OV}$, anode $\mathbf{54}_{OV}$, a magnet $\mathbf{66}_{OV}$, and hence an emitting slit (not shown in FIG. 3), have an oval-shaped configuration. As a result, a belt-like ion beam having a width of up to 1400 mm can be formed. Such an ion beam source is suitable for treating large-surface objects when these objects are passed over ion beam IB emitted through emitting slit 52.

With 1 to 3 kV voltage on the anode and various working gases, this source makes it possible to obtain ion beams with currents of 0.5 to 1A. In this case, an average ion energy is within 400 to 1500 eV, and a nonuniformity of treatment over the entire width of a 1400 mm-wide object does not exceed ±5%.

A disadvantage of the aforementioned ion source with a closed-loop ion-emitting slit is that the position of the tubular ion beam emitted from this source remains unchanged with respect to the surface of object OB being treated. However, the aforementioned tubular beam has a non-uniform distribution of the ion beam current in the cross-section of the beam and hence on the surface of the object OB. More specifically, the ion current density across the beam is greater in the center of the beam and is smaller on the edges of the beam.

Pending U.S. patent application Ser. No. 09/161,581 filed by the same Applicants on Sep. 28, 1998 discloses a closed-loop slit cold-cathode ion source where uniformity of treatment of an object is achieved by shifting either an object with respect to a stationary ion beam or by shifting the anode with respect to cathode or vice verse. Such displacements cause variations in relative positions between the object and the beam whereby even with some non-uniformity in the ion current density distribution in the beam, the surface of the object is treated with an improved uniformity.

A disadvantage of such a device is that the ion source or the ion-beam sputtering system should have movable parts which makes the construction of such source or system more complicated and expensive.

OBJECTS OF THE INVENTION

It is an object of the invention to provide a cold-cathode ion source with a closed-loop configuration of the ion-emitting slit, which allows for controlling the position of the ion beam with respect to the object being treated. Another object is to provide the ion source of the aforementioned type, which provides uniform ion- beam treatment. Another object is to provide uniformity in the ion current density distribution, purely due to the use of electrical means without the use of mechanically moveable parts. Still another object is to provide an ion source of the aforementioned type with uniform treatment, which is simple in construction and inexpensive to manufacture. Further object is to provide the ion source of the aforementioned type wherein the cathode functions as an electrostatic lens. Further object is to provide a method for improving uniformity of the ion current density on the surfaces of treated objects. Another object is to provide a cold-cathode ion source in which the composition of a coating film on the object can be adjusted by shifting the ion beam with respect to sputterable targets of different materials and by adjusting the beam residence time on the targets.

BRIEF DESCRIPTION OF THE DRAWINGS

FIGS. 6*a*, 6*b*, 6*c*, 6*d*, and 6*e* show different waveforms of alternating or pulsating voltage applied to the part of the cathode.

SUMMARY OF THE INVENTION

A cold-cathode ion source with a closed-loop ion-emitting slit, which is provided with, means for generating a permanent or a cyclically-variable, e.g., alternating or pulsating electric or magnetic field in an anode-cathode space. These means may be made in the form of a direct-current voltage generator or an alternating-voltage generator which generates a permanent positive or negative charge or an alternating voltage on one of the cathode parts with respect to the other part that forms the ion-emitting slit together with the first part. This permanent or alternating voltage deviates the ion beam in the slit, thus changing the beam between converging and diverging configurations. In the case of an alternating voltage, this change occurs with the frequency of the alternating voltage. The cold-cathode ion source may be of any type, i.e., with the ion beam emitted in the direction perpendicular to the direction of drift of electrons in the ion-emitting slit or with the direction of emission of the beam which coincides with the direction of electron drift.

Description of Preferred Embodiments of the Invention

In order to better understand the principle of the invention, it would be appropriate to explain a behavior of electrons and ions in the ion-accelerating and emitting space of a cold-cathode ion source having crossed electrical and magnetic fields. Ion beam sources of the aforementioned type are characterized by the following distinguishing features: electrons are held in cross electric and magnetic fields of such a magnitude at which the Larmor radius of an electron ($r_e$) is approximately equal to an anode-cathode distance (d), whereas the Larmor radius of an ion ($r_i$) significantly exceeds distance "d". The definition of the Larmor radius has been given above.

Figure 4A:
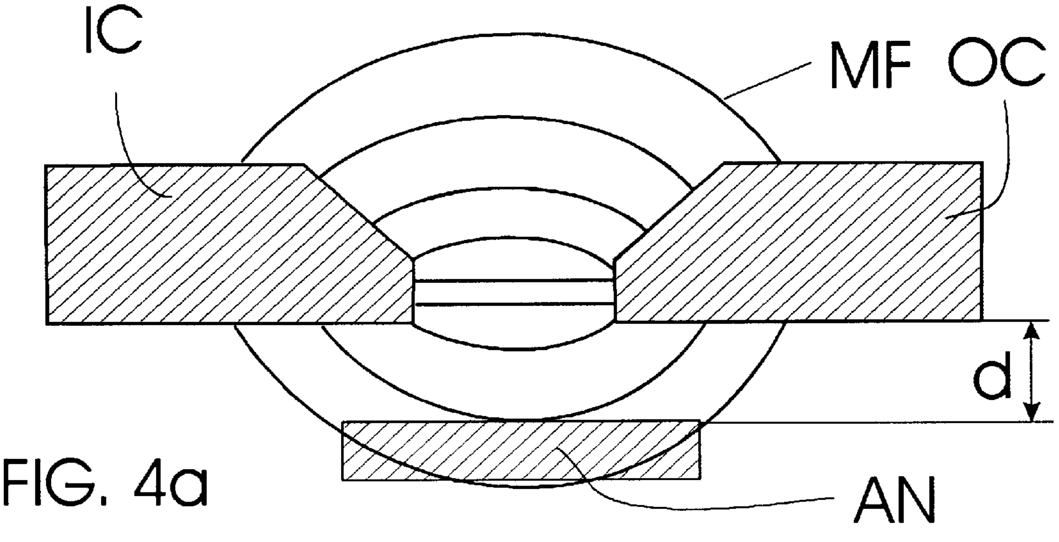
FIG. 4*a* is a cross-section of the ion-acceleration space of an ion source illustrating lines of magnetic field forces.
Figure 4B:
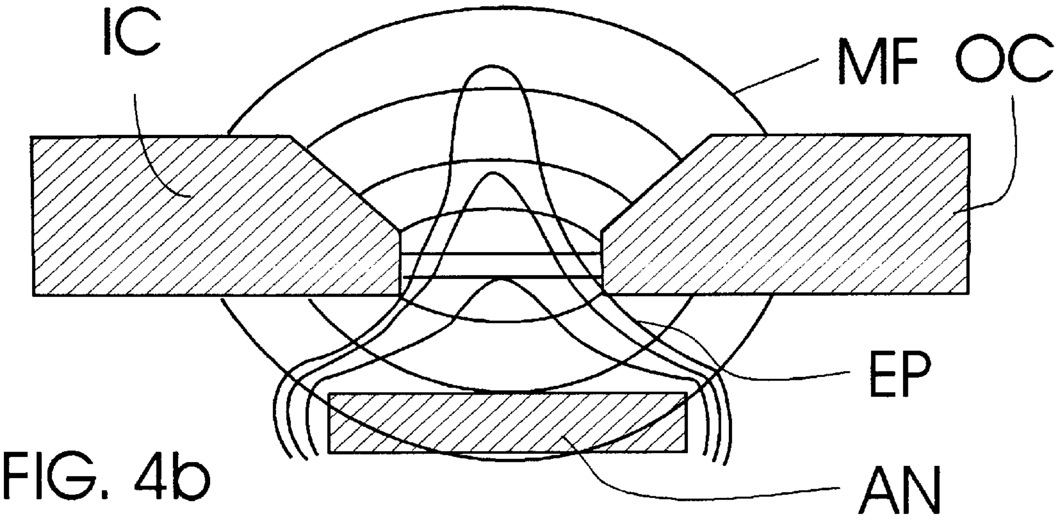
FIG. 4*b* is a view similar to FIG. 4*a* illustrating profiles of equipotentials when the potential difference is absent.
Figure 4C:
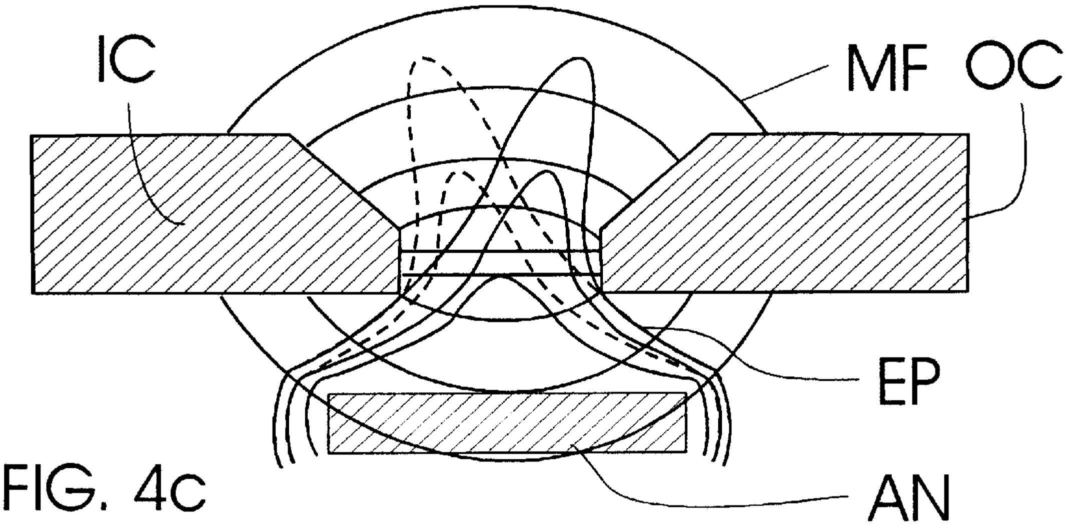
FIG. 4*c* is a view similar to FIG. 4*b* illustrating profiles of equipotentials when potential difference appears across the ion-emitting slit.

In the anode-cathode space the electrons ionize the working medium, and their spatial charge compensates for the positive spatial charge of the ion beam. Since $r_i$>>d, the magnetic field practically does not affect the ion trajectory. Ionization of practically any substance is ensured by high-energy electrons accelerated in an artificially-created potential "well" in a localized anode-cathode space. This is shown in FIGS. 4*a*, 4*b*, and 4*c*, which illustrate a cross-section of an ion-acceleration space of an ion source. FIG. 4*a* shows lines MF of magnetic field forces, FIG. 4*b* shows profiles of equipotentials EP across an ion-emitting slit IS under conditions when both parts IC (inner part) and OC (outer part) of the cathode are grounded, and FIG. 4*c* shows equipotentials under conditions of potential difference between the inner IC and outer OC parts of the cathode. An anode is designated as AN. The electrons are held in the anode-cathode space AC under the effect of crossed electric and magnetic fields, the potential wells, and the lens-like magnetic field.

Distribution of the ion-beam current density on the surface of an object being treated depends on the configuration of an ion beam, which, in turn, depends on trajectories of ions emitted by the ion source. These trajectories are defined by distribution of the aforementioned equipotentials in anode-cathode space AC, i.e., by the shapes of anode AN and cathode IC-OC and their mutual positions. Another factor affecting the ion trajectories is concentration and distribution of electrons, which ionize the working medium and compensate for the spatial positive charge of the ion beam in the zone of its formation.

The trajectories of ions and, hence, the shape of an ion beam may be changed discretely (by changing the geometry of the ion-optical system, i.e., the anode-cathode distance or shapes of the electrodes), or continuously (by adjusting the electric and magnetic fields in the anode-cathode space). The present invention is based on the second method which, in turn, may be realized as the following three embodiments: application of variable voltage between component parts of the cathode (accelerating electrode); application of a variable voltage to the anode; and the use of the cathode as an electrostatic lens capable of diverging or converging the ion beam due to application of a constant potential difference between the inner and outer parts of the cathode.

Figure 5:
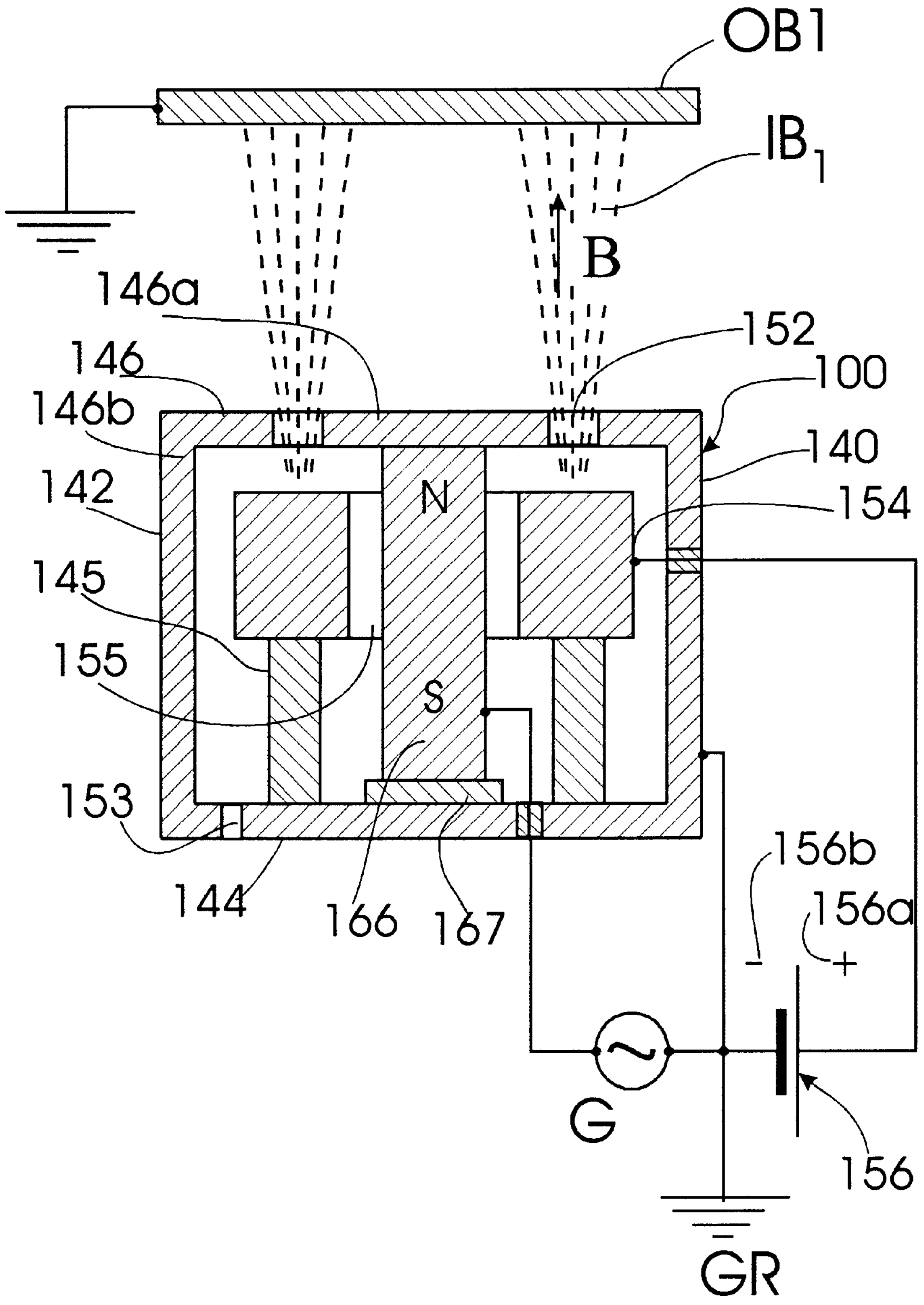
FIG. 5 is a schematic sectional view of an ion beam source of the present invention with the application of a variable voltage to a permanent magnet and hence to the inner part of the cathode which is in electrical contact with the magnet.

FIG. 5—Embodiment of the Ion Source with Application of a Variable Voltage Between the Inner and Outer Parts of the Cathode FIG. 5 is a schematic sectional view of an ion beam source 100 of the present invention with the application of a variable voltage between component parts of the cathode (accelerating electrode). The ion beam source shown in FIG. 5 is the one having a closed-loop type ion-emitting slit of an oval, elliptical, or a round configuration of the kind described with reference to FIGS. 1 through 3. The models shown in FIGS. 4*a*, 4*b*, and 4*c* are applicable to the construction of the ion source of the type shown in FIG. 5.

The ion source 100 of FIG. 5 has a hollow cylindrical housing 140 made of a magnetoconductive material such as Armco steel (a type of a mild steel), which is used as a cathode. Housing 140 has a side wall 142 of an oval, elliptical, or a circular cross section which is concentric to the shape of an ion emitting slit 152 formed in a top flat side 146 of cathode housing 140. The lower side of housing 140 is closed with a flat bottom 144.

A working gas supply hole 153 is formed in flat bottom 144. Flat top side 146 functions as an accelerating electrode. Placed inside the interior of hollow cylindrical housing 140 between bottom 144 and top side 146 is a permanent magnet 166 with poles N and S of opposite polarity. An N-pole faces flat top side 146, and S-pole faces bottom side 144 of the ion source and is electrically isolated therefrom by an insulating body 167, e.g., of a ceramic. The purpose of magnet 166 is to generate a closed magnetic circuit passing through parts 166, 140, 142, 144, and through ion emitting slit 152. It is understood that this magnetic system is shown only as an example and that it can be formed in a manner described, e.g., in aforementioned U.S. Pat. No. 4,122,347. An anode 154, which is connected to a positive pole 156*a* of an electric power source 156, is arranged in the interior of housing 140 around magnet 166 and concentric thereto and to ion-emitting slit 152. Anode 154 is fixed inside housing 140 by means of an insulating body 145 made of non-magnetic dielectric material such as ceramic. Anode 154 has a central opening 155 in which aforementioned permanent magnet 166 is installed with a gap between the outer surface of the magnet and the inner wall of opening 155. A negative pole 156*b* of the electric power source is connected to housing 140, which is grounded at GR.

Figure 6A:
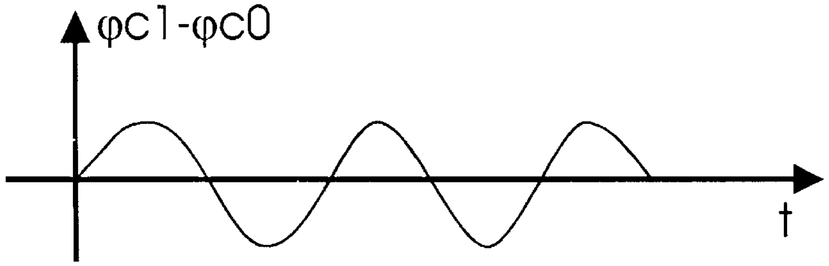
Figure 6B:
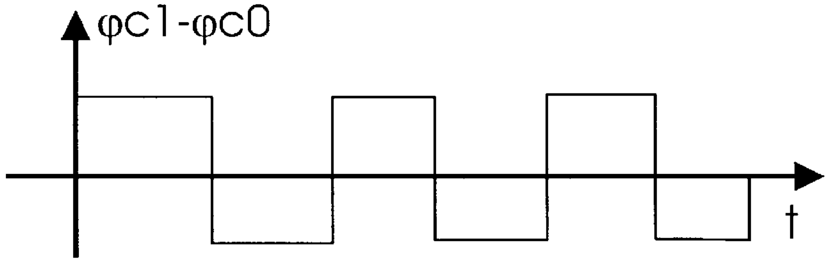
Figure 6C:
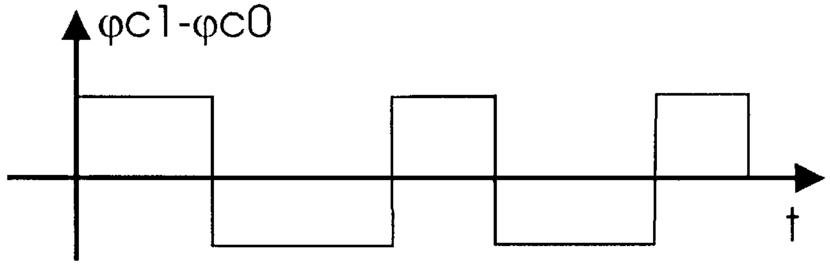
Figure 6D:
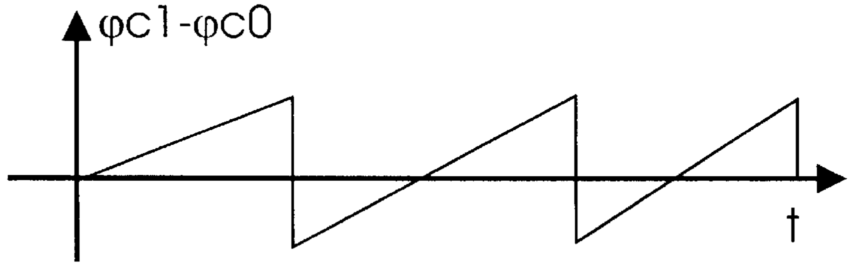

Magnet 166 is connected to one side of an additional power source such as a generator G of an alternating or a pulsating voltage. The other end of generator G is grounded at GR. Emitting slit 152 divides upper part 146 of the cathode into two electrically isolated parts, i.e., an inner or central cathode 146*a* and an outer cathode part 146*b*. Thus, central part 146*a* of top flat plate 146, the periphery of which defines the inner side of ion-emitting slit 152, is subject to application of alternating or pulsating potential with respect to the grounded outer part 146*b* of the cathode. As shown in FIGS. 6*a*, 6*b*, 6*c*, 6*d*, and 6*e*, the alternating or pulsating voltage generated by generator G may have different waveforms. FIG. 6*a* shows a sinusoidal waveform with an amplitude varying from a negative to a positive value, FIG. 6*b* shows a square waveform with an amplitude varying between positive and negative values of the same magnitude, FIG. 6*c* shows a square waveform with different pulse and pulse interval duration, FIG. 6*d* shows a saw-tooth waveform with an amplitude varying between a negative and positive values. It is understood that these waveforms are given only as examples and a great variety of other waveforms are possible, depending on specific working conditions and requirements of an ion beam process. What is important is that when generator G is energized, an alternating voltage V is applied across ion-emitting slit 152.

Figure 1:
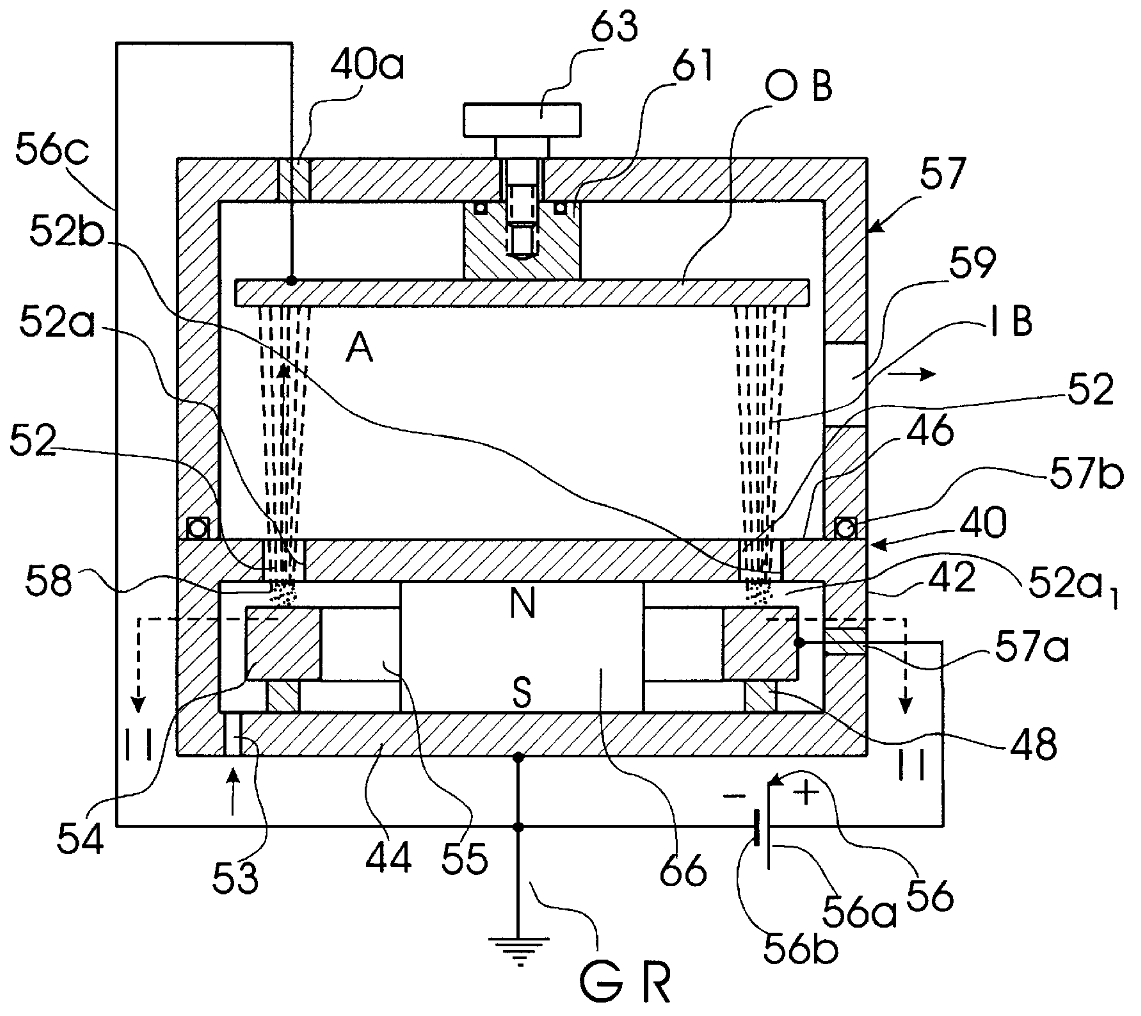
FIG.1. PRIOR ART
FIG. 1 is a sectional side view of a known ion-beam source with a circular ion-beam emitting slit.
Figure 2:
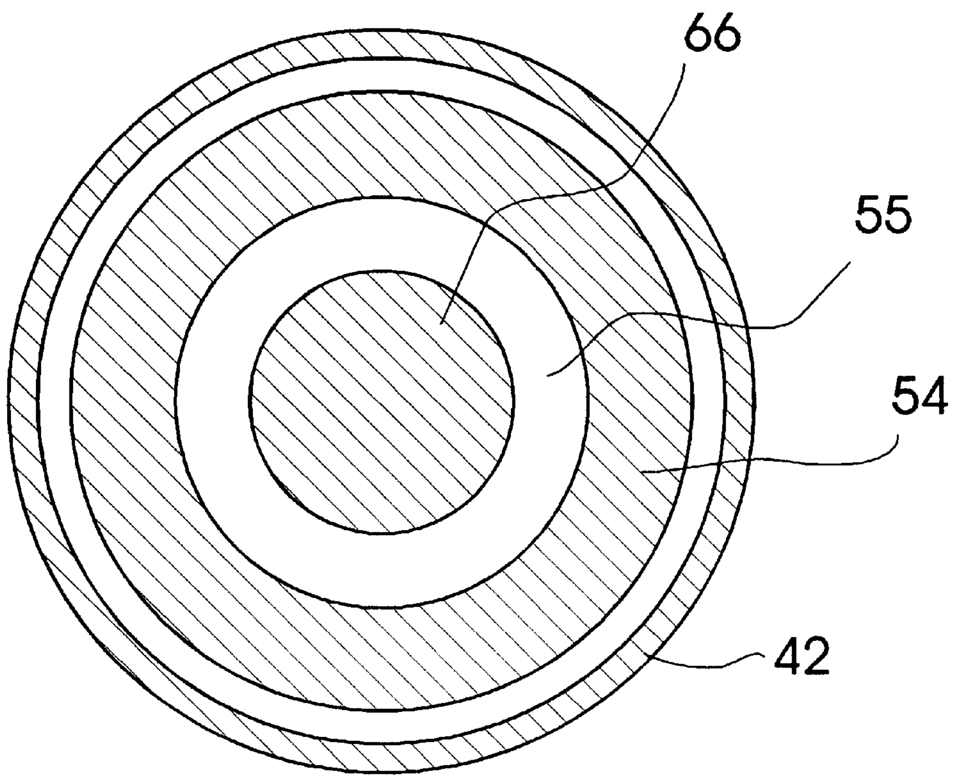
FIG. 2. PRIOR ART
FIG. 2 is a sectional plan view along line II—II of FIG. 1.
Figure 3:
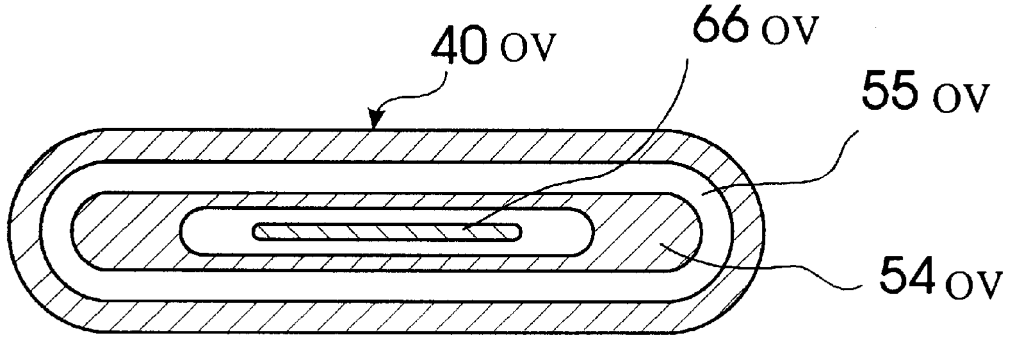
FIG. 3. PRIOR ART
FIG. 3 is a view illustrating the shape of the closed-loop slit in a cross section perpendicular to the beam direction.

It is understood that similar to a known ion source of FIGS. 1 through 3, the entire unit shown in FIG. 5 is placed together with an object $OB_1$ into a vacuum chamber (not shown).

When working medium is supplied into hollow housing 140 which is maintained under vacuum from a vacuum source (not shown), constant positive bias voltage $U_O$ is applied to anode 154 from positive pole 156*a* of power source 156, outer part 146*b* of top flat plate 146 of the cathode is grounded, and alternating voltage $U_G$ is applied from generator G to central part 146*a* of top flat plate 146 via magnet 166. As a result, an alternating electric field is induced in ion-emitting slit 152 between the grounded part 146*b* of top flat plate 146 and central part 146*a*, which is electrically insulated from the housing by insulating plate 167.

Ion beam $IB_1$ is generated in the source in a conventional manner described earlier in connection with the ion source of FIGS. 1 through 3. When this beam passes through ion-emitting slit 152 in the direction of arrow B (FIG. 5) toward an object OB1 to be treated, the aforementioned electric field causes deviation of the beam with the same frequency as the frequency of the electric field. In other words, equipotentials EP shown in FIG. 4*b* will oscillate between two extreme positions shown in FIG. 4*c*, with the frequency of the applied voltage and hence of the electric field. The aforementioned voltage may be, e.g., a voltage $U_{C=UCo}$ Sin ωt, where $U_{Co}$ does not exceed the potential difference $U_{a-c}$ between the anode and cathode.

Figure 7A:
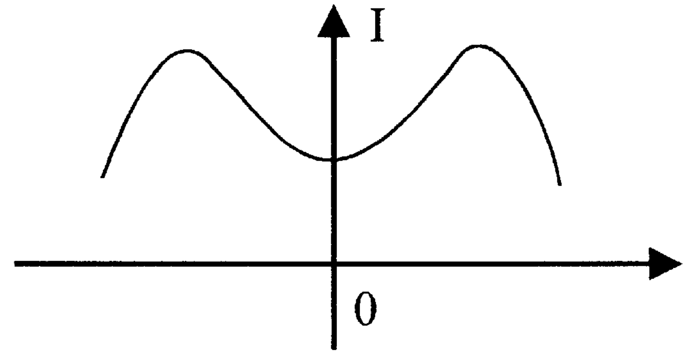
FIGS. 7*a*, 7*b*, 7*c*, 7*d* are graphs that show distribution of ion current density on the surface of object OB1 at different moments of time for an ion emitting slit of a circular shape.
Figure 7B:
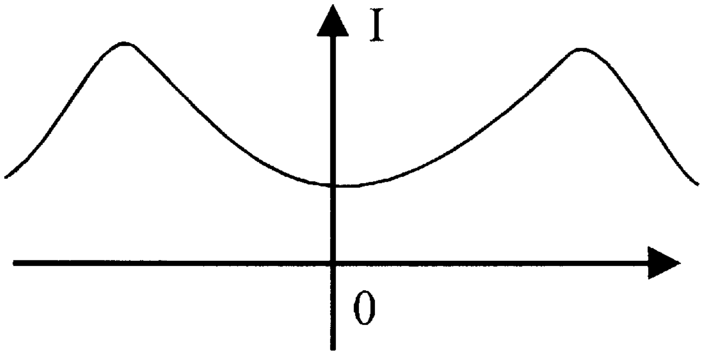
Figure 7C:
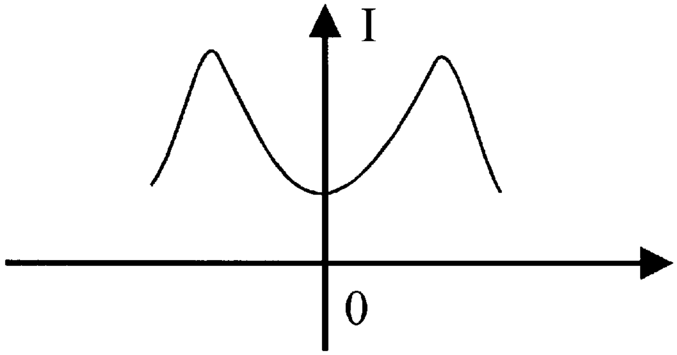
Figure 7D:
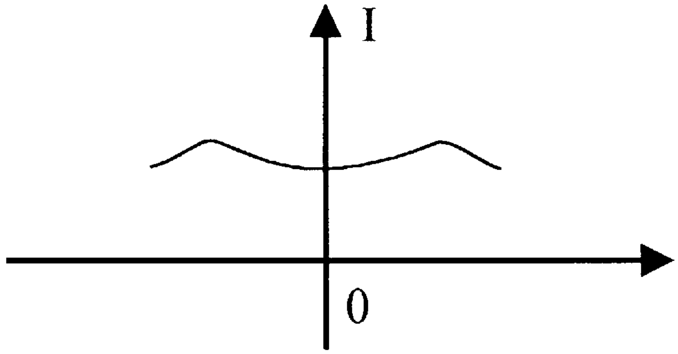

FIGS. 7*a*, 7*b*, 7*c*, 7*d* show distribution of ion current density on the surface of object $OB_1$ at different moments of time for an ion emitting slit of a circular shape. Distances from the center of object $OB_1$ toward its periphery are plotted on the abscissa axis, and the ion current density Ion the surface of object $OB_1$ is plotted on the ordinate axis. At the moment shown in FIG. 7*a*, the potential difference produced by generator G between the parts of the cathode is absent. FIG. 7*b* corresponds to the moment when the central part 146*a* has a positive charge. In this case positively-charged ions are shifted towards outer part 146*b*. As a result, the ion beam diverges. When central part 146*a* is charged negatively with respect to the outer part 146*b*, the ion beam converges. This condition corresponds to FIG. 7*c*. Since these phenomena occur with the frequency of voltage alternation, e.g., 60 times per second, the distribution of current density in the beam across ion slit 152 is averaged to the form shown in FIG. 7*d*. It is understood that FIG. 7*d* shows averaging during only one cycle.

Normally, an absolute value $|U_G|$ of the alternating or pulsating voltage applied from generator G is within the range of 1 to 15% of the bias voltage $U_a$ applied to the anode. $U_a$ is within the range of 200 V to 5 kV.

Figure 8:
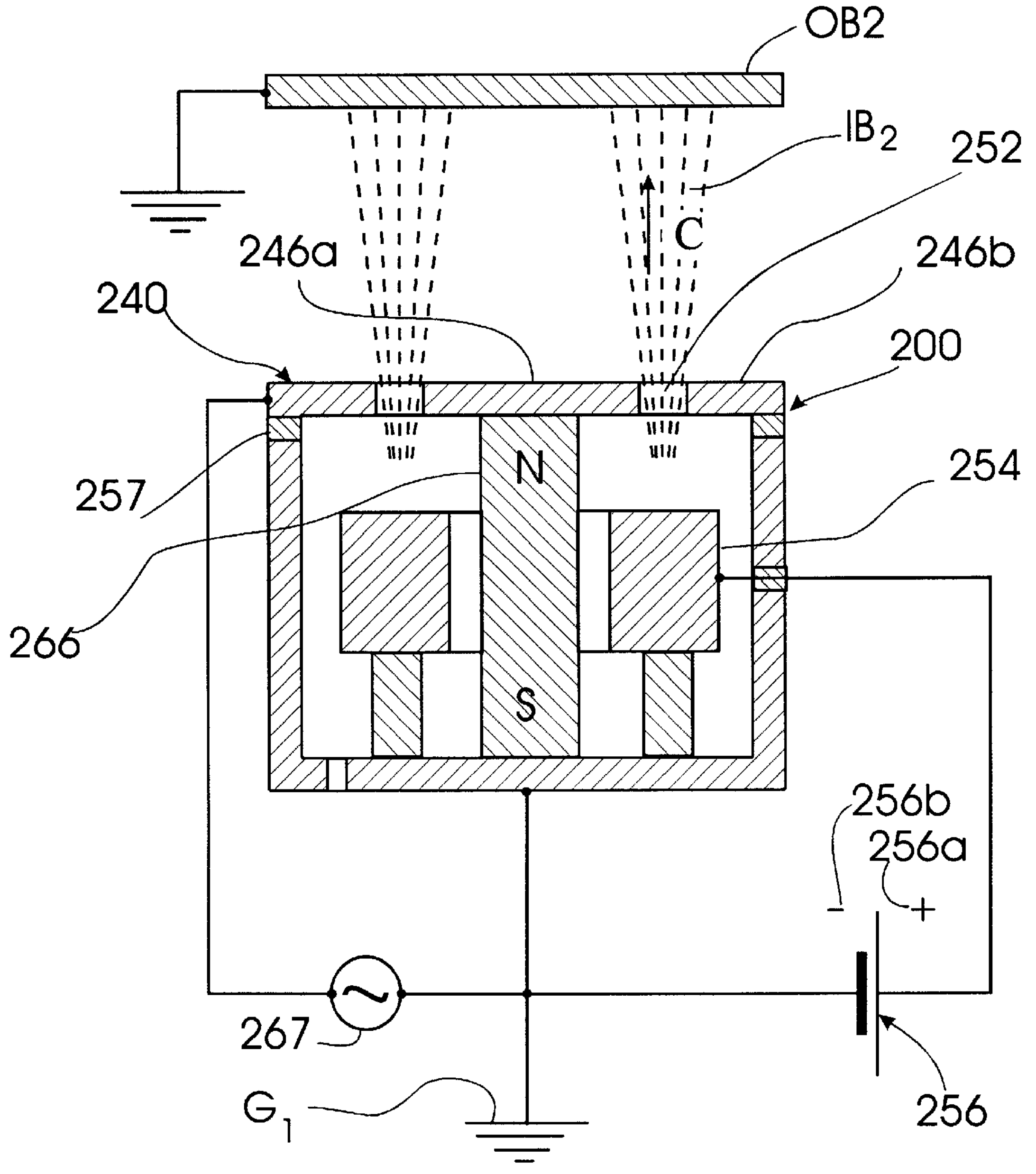
FIG. 8 is a schematic sectional view of an ion-emitting source with an alternating or pulsating voltage applied to an outer part of a top flat plate of the cathode.

FIG. 8 illustrates another embodiment of an ion source 200 which structurally is identical to the one shown in FIG. 5 and differs from it in that the alternating or pulsating voltage is applied to an outer part 246*b* of a top flat plate 246 of a cathode 240, while a central part 246*a* is grounded at 267 via a magnet 266. Outer part 246*b* and central part 246*a* are electrically isolated from each other by a closed-loop ion-emitting slit 252 and by an insulating plate 257. Similarly to the device of FIG. 5, a constant bias voltage $U_a$ is applied to an anode 254 from a positive pole 256*a* of a power source 256. An alternating or pulsating voltage $U_G$ is applied from a generator $G_1$ to outer part 246*b* of top flat plate 246. The ratio between $U_G$ and $U_a$ is the same as in the previous embodiment.

Ion beam $IB_2$ is generated in source 200 in a conventional manner described earlier in connection with the ion source of FIGS. 1 through 3. When this beam passes through ion-emitting slit 252 in the direction of arrow C (FIG. 8), the alternating or pulsating electric field causes deviation of the beam with the same frequency as the frequency of the electric field. This occurs on the basis of the same mechanism as has been described with regard to the embodiment of FIG. 5. As a result, the equipotentials shown in FIG. 4*b* will oscillate between two extreme positions shown in FIG. 4*c*, with the frequency of the applied voltage and hence of the electric field. This will average the distribution of the current density on the surface of the object being treated to the shape shown in FIG. 7*d*.

Figure 9:
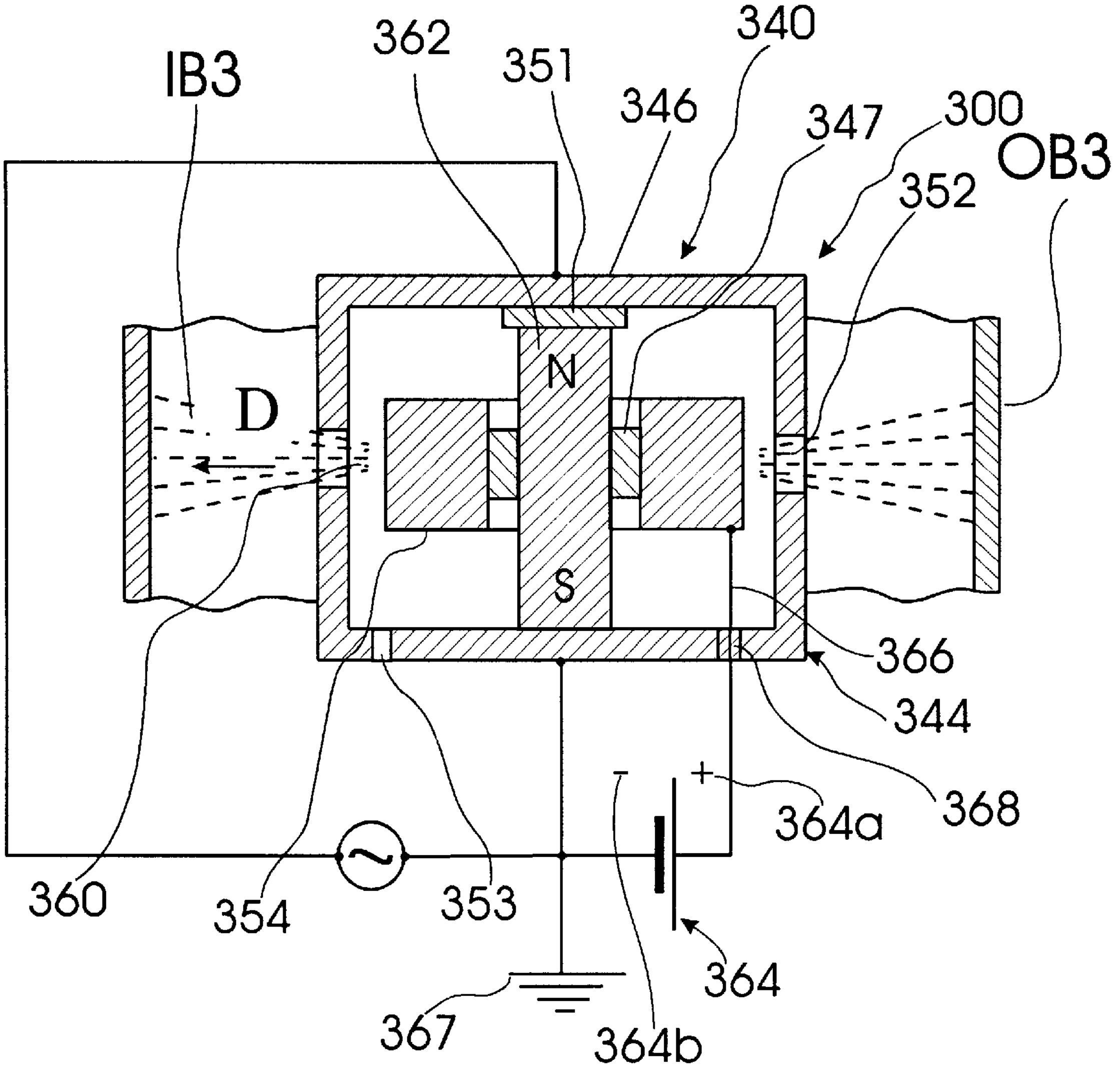
FIG. 9 is a schematic sectional view of a cold-cathode ion source of the invention with emission of ion beams in a radial outward direction in a plane of drift of electrons, the alternating voltage generator being connected to the upper part of the cathode.

FIG. 9 is a schematic sectional view of a cold-cathode ion source of the invention with emission of ion beams in a radial outward direction in the plane of drift of electrons. In a top view, the housing or cathode of this ion source, as well as the contours of the ion-emitting slit, may have a circular, oval, or elliptical configuration. It is understood that, strictly speaking, oval or ellipse does not have a radial direction and that the word "radial" is applicable to a circle only. However, for the sake of convenience, here and hereinafter, including patent claims, the terms "radial" and "radially" will be used in connection with any closed-loop configuration of the ion-emitting slit from which the ion beams are emitted inwardly or outwardly perpendicular to the circumference of the ion-emitting slit.

An ion source of this embodiment, which in general is designated by reference numeral 300, has a hollow housing 340 made of a magnetoconductive material which is used as a cathode.

Housing 340 has a box-like lower part 344 with one side of the box open and a box-like upper side 346 with one side of the box open. Open sides of box-like parts 344 and 346 face each other and form a through closed-loop ion-emitting slit 352 around the entire periphery of housing 340, approximately in the middle of the height of the housing.

A working gas supply hole 353 is also formed in the bottom of lower part 344 of the cathode housing 340.

A magnetic-field generation means, which in this embodiment includes a permanent magnet 362, is located inside an anode 354 and is spaced from the inner surface of the anode. According to the invention, upper and lower parts 346 and 344, in particular adjacent parts of housing 340 which form ion-emitting slit 352, are electrically isolated from each other by ion-emitting slit 352 and by an insulation plate 351 between an N-pole of magnet 362 and upper plate 346 of the cathode.

Anode 354 is fixed inside the housing by means of a ring-shaped body 347 placed in a gap between the inner wall of anode 354 and an outer surface of magnet 362. Anode 354 is electrically connected to a positive pole 364*a* of an electric power supply unit 364 by a conductor line 366 which passes into housing 340 via a conventional electric feedthrough 368. Cathode 340 is electrically connected to a negative pole 364*b* of power supply unit 364.

Upper part 346 is connected to an additional power source, e.g., to one side of an alternating voltage generator $G_2$, and the other side of generator $G_2$ is grounded at 367. Lower part 344 of the housing is also grounded at 367.

In operation, vacuum chamber or an object, such as a tube ($OB_3$) into which the source is inserted, is evacuated, and a working gas is fed into the interior of housing 340 of ion source 300 via inlet opening 353. A magnetic field is generated by permanent magnet 362 in an ionization space 360 between anode 354 and cathode 340, whereby electrons begin to drift in a closed path within the crossed electrical and magnetic fields. In the case of the device of the invention, the electrons begin to drift in annular space 360 between anode 354 and cathode 340 in the same direction in which the ions are emitted from the annular slit, i.e., in the radial outward direction shown by arrow D in FIG. 9.

More specifically, a plasma is formed in space 360 between anode 354 and cathode 340 and partially inside ion-emitting slit 352. When the working gas is passed through ionization and acceleration space 360, an ion beam $IB_3$, which propagates outwardly in the direction shown by arrows D, is formed in the area of ion-emitting slit 352 and in accelerating space 360 between anode 354 and cathode 340.

Since, during operation of the source, the alternating voltage $U_G$ is applied from generator $G_2$ to upper part 346 of cathode 340 and since lower part 344 of the cathode is grounded, an alternating electric field is induced in ion-emitting slit 352 between the grounded lower part 344 and upper part 346 which is under alternating or pulsating voltage. This electric field operates across ion-emitting slit 352.

When aforementioned ion beam IB3 passes through ion-emitting slit 352 in the direction of arrow D (FIG. 9), the alternating electric field causes the beam to deviate with the same frequency as the frequency of the applied voltage. As a result, the equipotentials begin to alternate in the same manner as shown in FIGS. 4*c*. Normally, an absolute value $|U_G|$ of the alternating or pulsating voltage applied from generator $G_2$ is within the range of 1 to 15% of the bias voltage $U_a$ applied to anode 354. $U_a$ is within the range of 200 V to 5 kV.

Ion source 300 of this embodiment is suitable for treating inner surfaces of tubular bodies.

It is understood that the object and hence ion source 300 are located in a vacuum chamber (not shown) which may be identical to the one described in connection with the prior art. It is also understood that the object (such as a tube) itself can be sealed and evacuated.

Figure 10:
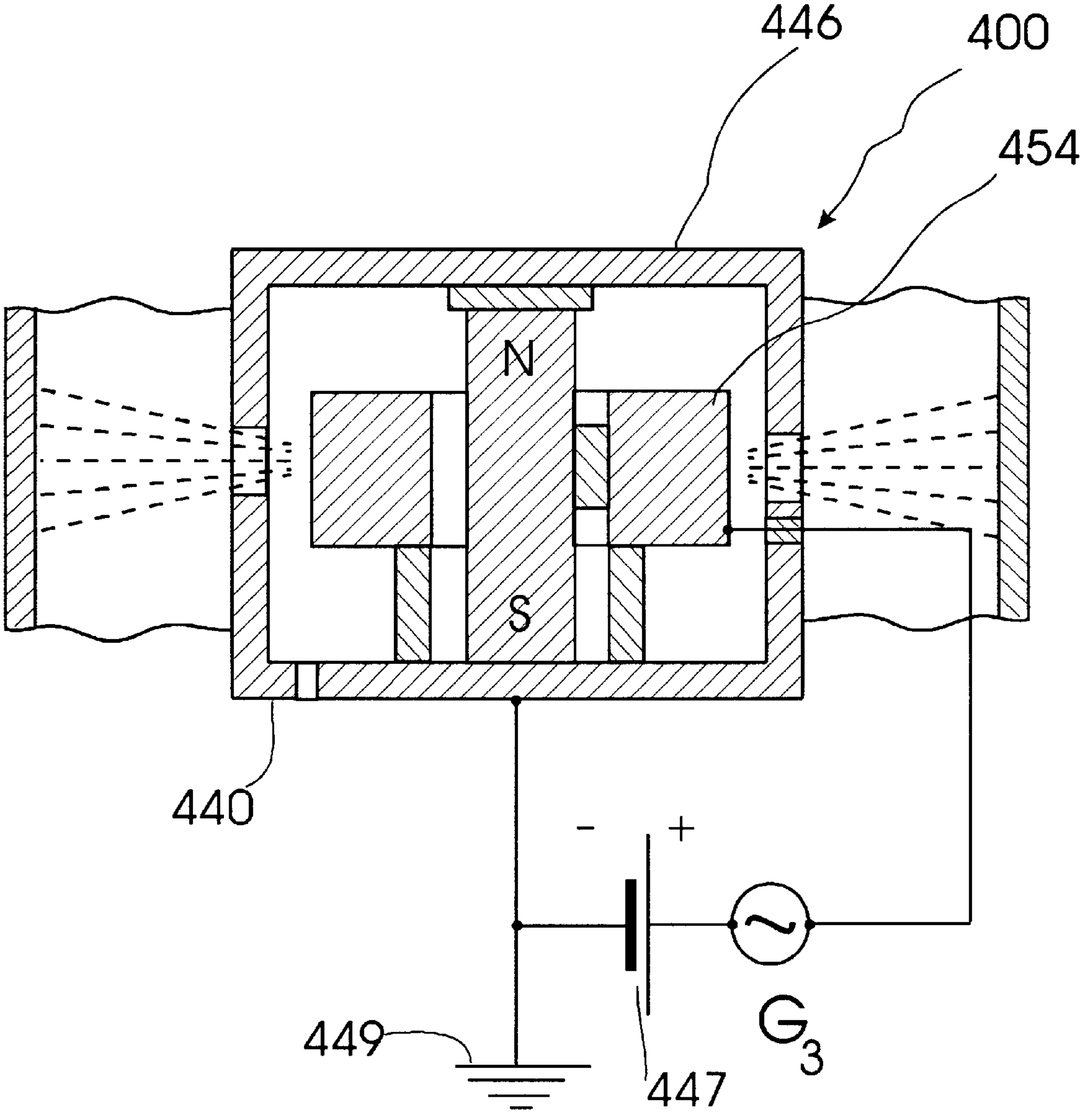
FIG. 10 is schematic sectional view of an ion source similar to the one shown in FIG. 9 in which the pulsating side of the alternating voltage generator is connected to an anode.

FIG. 10 shows another embodiment of an ion source 400 with propagation of the ion beam in the direction of drift of electrons. This embodiment is similar to the one shown in FIG. 9 and differs from it in that the pulsating side of the alternating voltage generator $G_3$ is connected to an anode 454, rather than to an upper part 446 of the housing. The other end of voltage generator $G_3$ is connected to a positive side of a direct current source 447. The negative side of this source is connected to housing 440 and is grounded at 449.

The ion source of this embodiment operates in the same manner as ion source 300 of FIG. 9.

Figure 11:
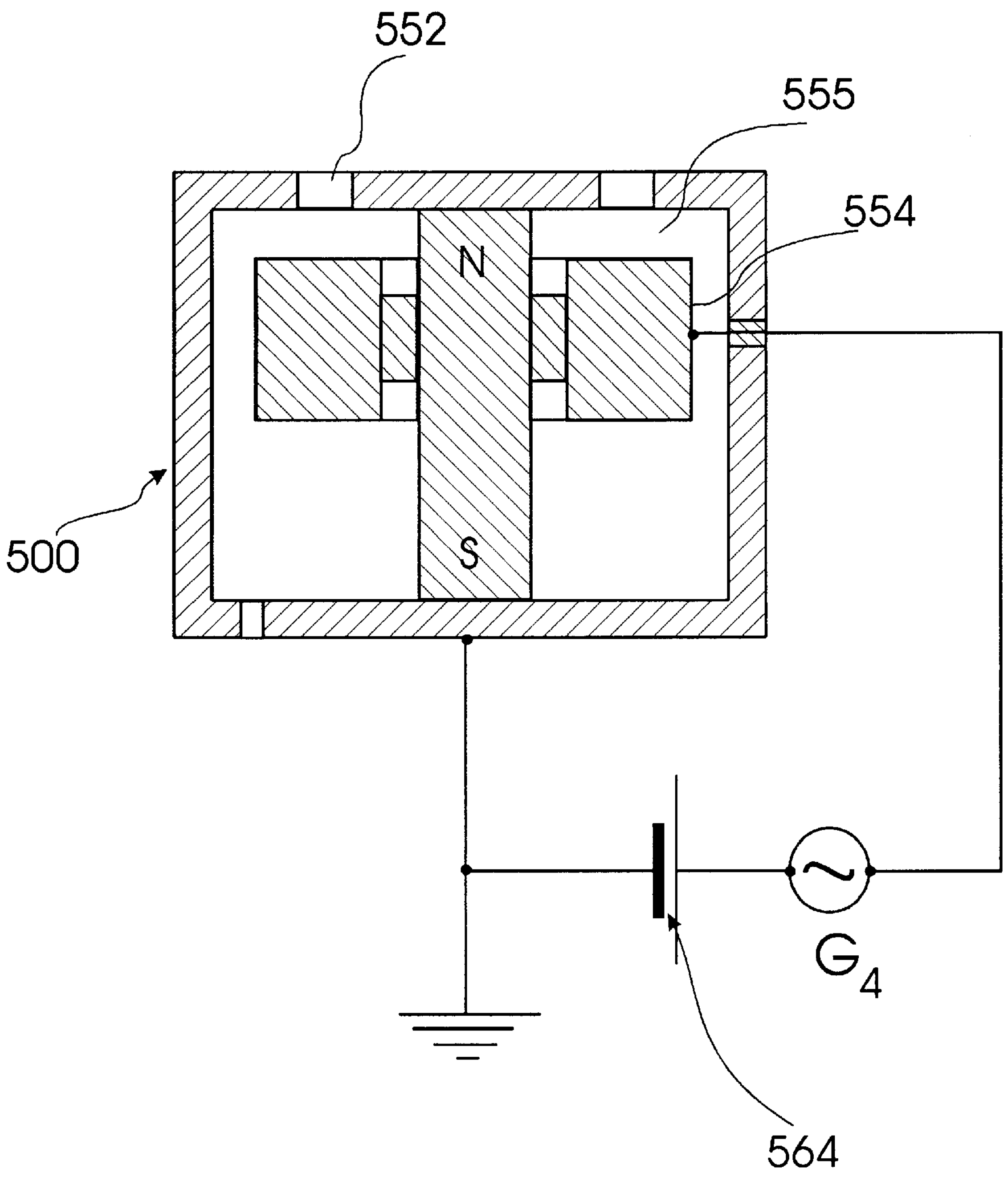
FIG. 11 is a schematic sectional view of an ion source of the type shown in FIG. 8 with the alternating voltage generator being connected to the anode and with the entire cathode being grounded.

The embodiment shown in FIG. 11 relates to an ion source 500, in which the alternating voltage $U_a$ is applied from a generator $G_4$ to an anode 554. Construction of other elements of source 500 is the same as in the previous embodiments with the application of the alternating voltage to the parts of the cathode. In the embodiment of FIG. 11, the variation of potential on anode 554 changes the divergence and convergence of the ion beam rather than causes alternation of the ion beam between the outer and inner parts of the cathode.

With the low values of $U_{Ao}$, (where $U_{Ao}$ is the constant component of the voltage applied to anode 554 from direct current source 564), application of pulsating or alternating voltage, e.g., $U_G$ Sin ωt, from generator G4, shifts the ionization zone from anode 554 to ion-emitting slit 552, thus increasing the divergence of the beam. When $U_{Ao}$ is increased, the ionization zone approaches anode 554, and the divergence of the beam is reduced. Thus, superposition of $U_G$ Sin ωt onto constant component $U_{Ao}$ makes it possible to cyclically change the ion beam shape, and thus to improve the uniformity of the ion beam current on the surface of the object being treated.

Figure 12:
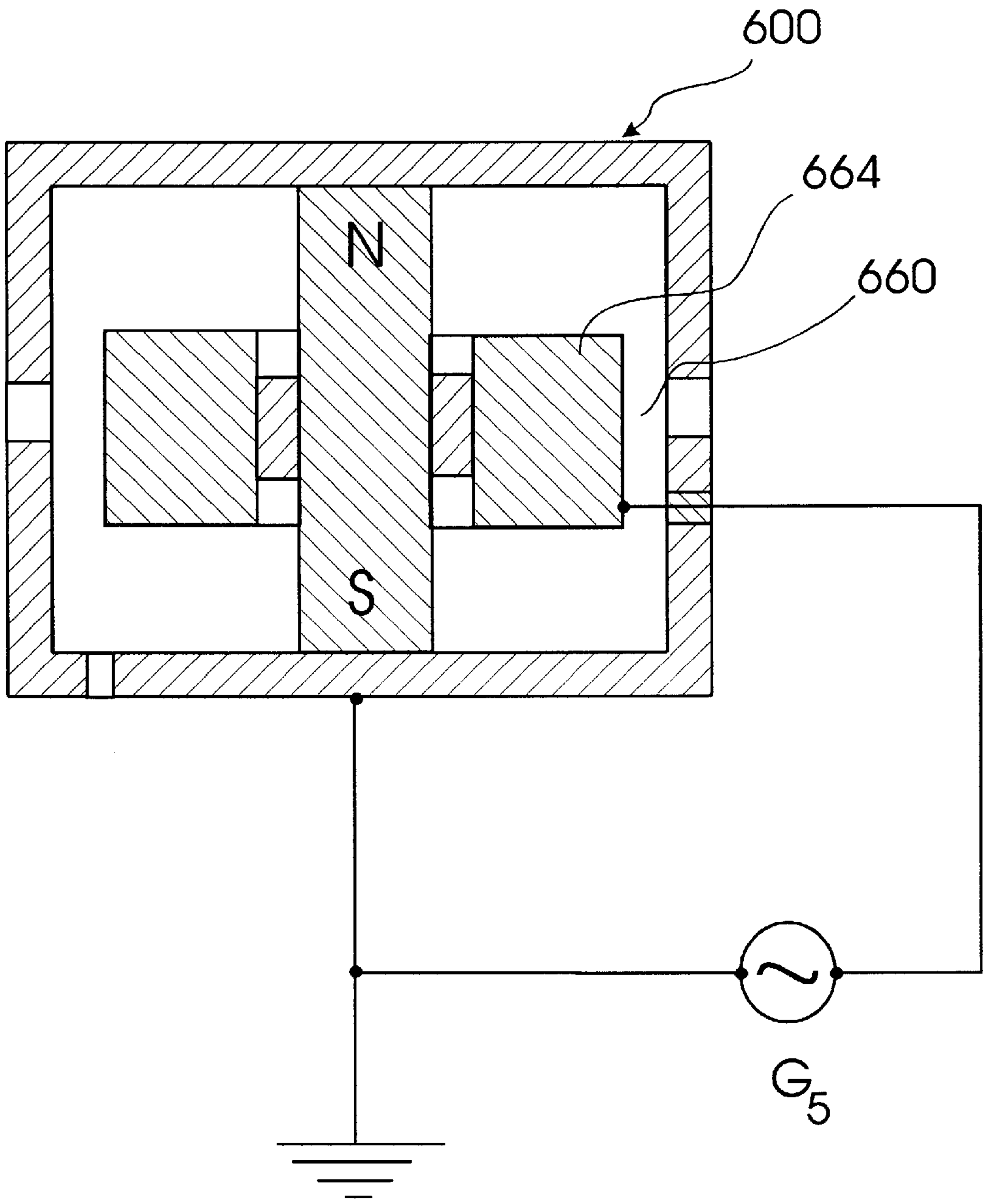
FIG. 12 is an embodiment of an ion source of the type similar to the one shown in FIG. 11 with the anode connected only to a source of alternating voltage, without the use of a D.C. power source.

FIG. 12 shows an embodiment of an ion source 600 of the type similar to the one shown in FIG. 11 with an anode 664 connected only to a source of alternating voltage $G_5$, i.e. without connection to a positive pole of a D.C. power source. In this case the charge will be ignited on the positive half-wave of the voltage pulse and will be dampened on the negative half-wave. In other words, the ion source 600 may operate in a pulse mode with the frequency equal to the frequency of the positive voltage, e.g., 50 Hz. An advantage of an ion source of this type is simplicity of the construction, since it may operate merely from a conventional power supply main. However, in order to ignite the plasma in an anode-cathode ion-accelerating space 660, the alternating voltage should be sufficient for the specific pressure of the working medium.

Figure 13:
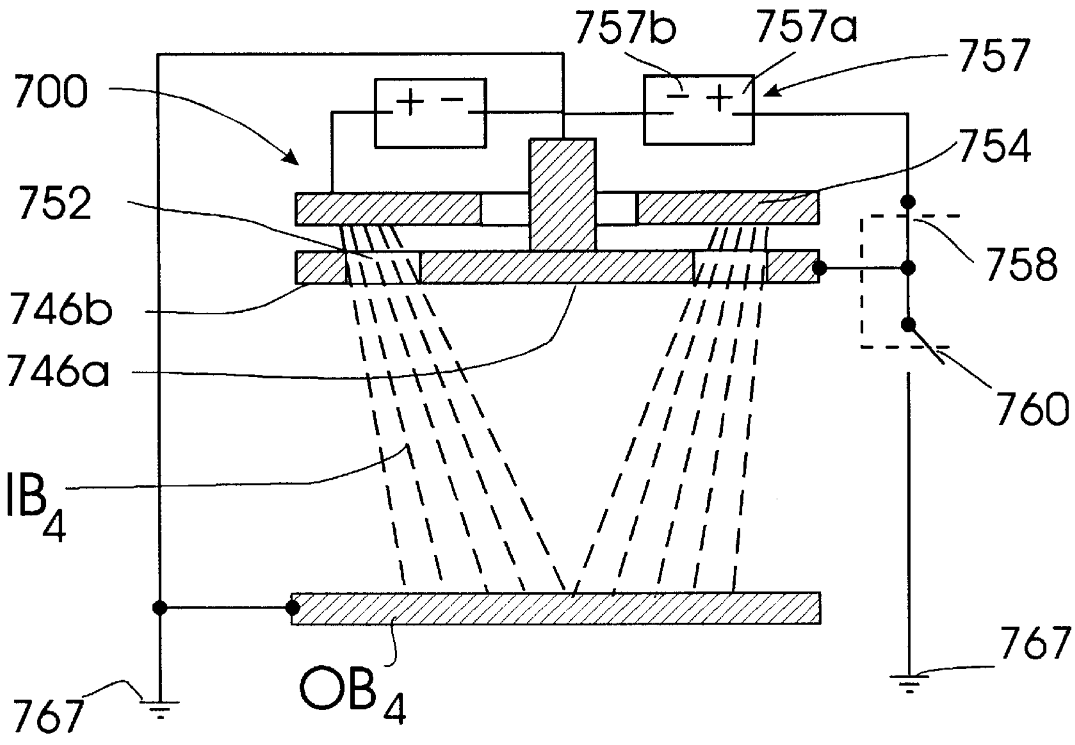
FIG. 13 is a fragmental view of an ion source of an embodiment similar to the one shown in FIG. 8 in which an additional power source connected to the outer part of the cathode is a source of a constant potential.

FIG. 13 is a fragmental view of an ion source 700 of an embodiment which is similar to the one shown in FIG. 8 and differs from it in that the additional power source which is connected to the outer part of the cathode is a source of a constant potential, instead of an alternating voltage generator. Parts and units of the embodiment of FIG. 13, which are similar to those of the embodiment of FIG. 8, will be designated by the same reference numerals with an addition of 500 and their description will be omitted. For example, ion source 700 has anode 754, an outer part 746*b* of the anode and an inner part 746*a* of the cathode. The housing or the remaining part of the cathode, as well as the anode holders, the working gas supply openings, and other elements identical with those of FIG. 8 are not shown.

An additional power source connected to outer part 746*b* of the cathode is a direct current source 757 which has a positive terminal 757*a* connected to outer part 746*b* of the cathode, and a negative terminal is grounded at 767.

Ion source 700 of FIG. 13 operates as an electrostatic ion lens. In principle, it operates in the same manner as it has been described for a single cycle of ion source 200 of FIG. 8 with reference to FIGS. 4*a*, 4*b*, and 4*c*. The only difference is that the additional electric field across ion-emitting slit 752 remains constant once it has been adjusted and will change only if the magnitude of the positive potential is adjusted, e.g., with the use of a programming device (not shown).

In the embodiment of FIG. 13, direct current source 757 has a switch 758 for disconnecting source 757 from outer part 746*b* of the cathode. Switch 758 is interlocked with a switch 760 that connects outer part 746*b* to the ground simultaneously with disconnection thereof from source 757.

Figure 13A:
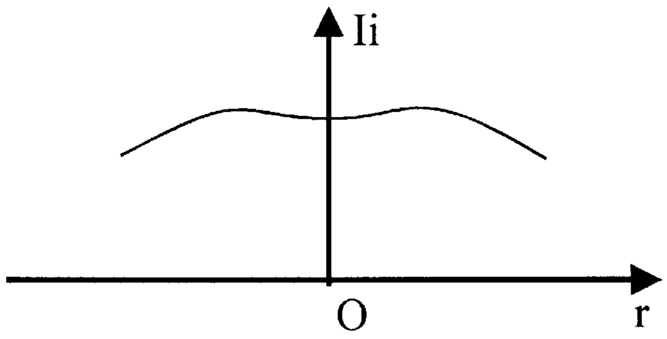
FIG. 13*a* is the current density distribution.

When the ion source 700 is in operation, and an ion beam IB4 is emitted through ion-emitting slit 752 toward an object $OB_4$, the application of a constant potential to outer part 746*b* of the cathode, which is positive with respect to grounded inner part 746*a*, will cause ion beam $IB_4$ to converge, as shown in FIG. 13. This condition corresponds to the pattern of the current density distribution on the surface of the object shown in FIG. 13*a* with a substantially flat current curve.

When outer part 746*b* is disconnected from source 757 and is grounded, ion beam $IB_4$ will return to the normal direction of propagation, i.e., will diverge from the position shown in FIG. 13. As a result, the current density distribution will acquire a pattern shown in FIG. 14*a*.

Figure 14:
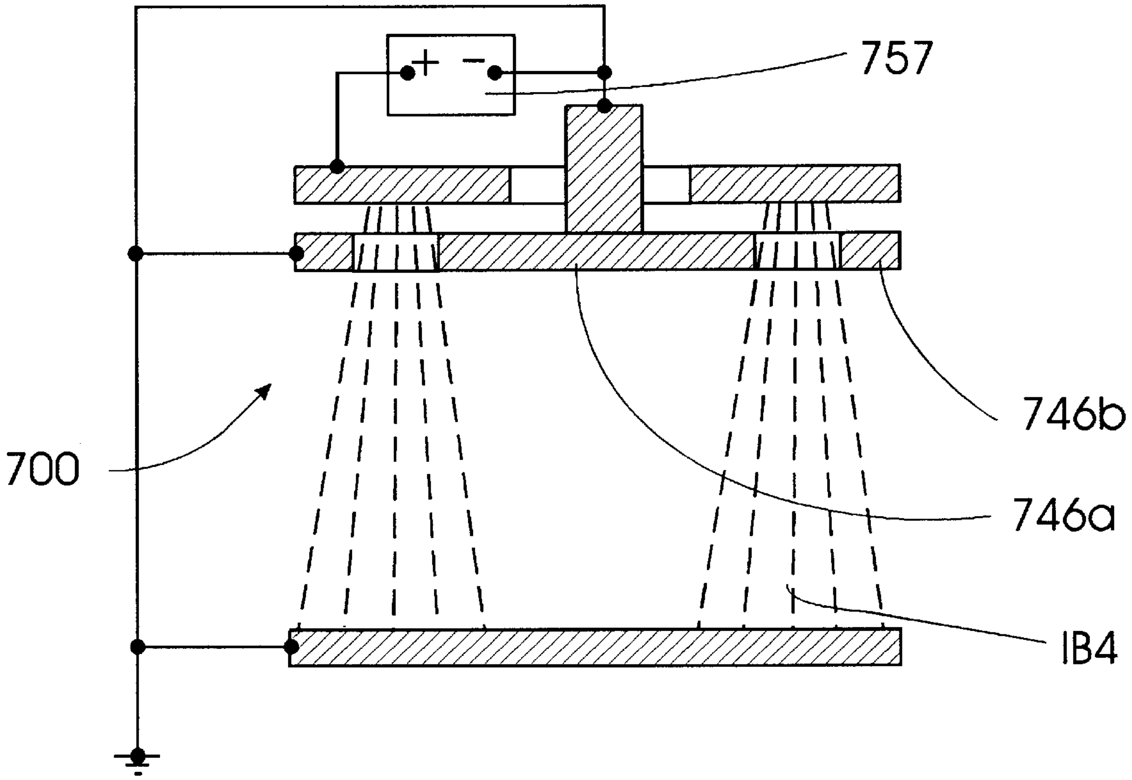
FIG. 14 shows the ion source of FIG. 13 in a condition when one switch connects the outer part of the cathode to the ground, and the second switch disconnects the additional voltage source.
Figure 14A:
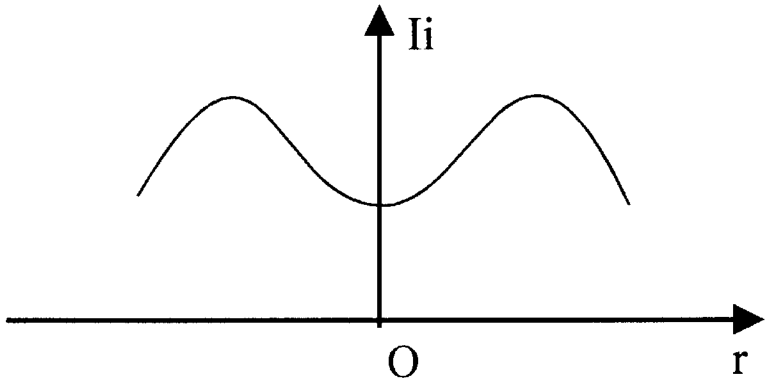
FIG. 14*a* is the current density distribution.

FIG. 14 shows ion source 700 in a condition when switch 760 is closed and connects outer part 746*b* of the cathode to the ground. At the same time, switch 758 is opened.

When ion source 700 operates under above conditions, both parts of the cathode are grounded, so that ion beam $IB_4$ will assume its neutral or symmetrical position shown in FIG. 14. In other words, ion source 700 will operate in the same manner as the conventional ion source of FIGS. 1 through 3. Thus it has been shown that by placing switches 760 and 758 (FIG. 13) into open or closed positions, it becomes possible to utilize ion source 700 as an electrostatic ion lens for the ion beam.

Figure 15:
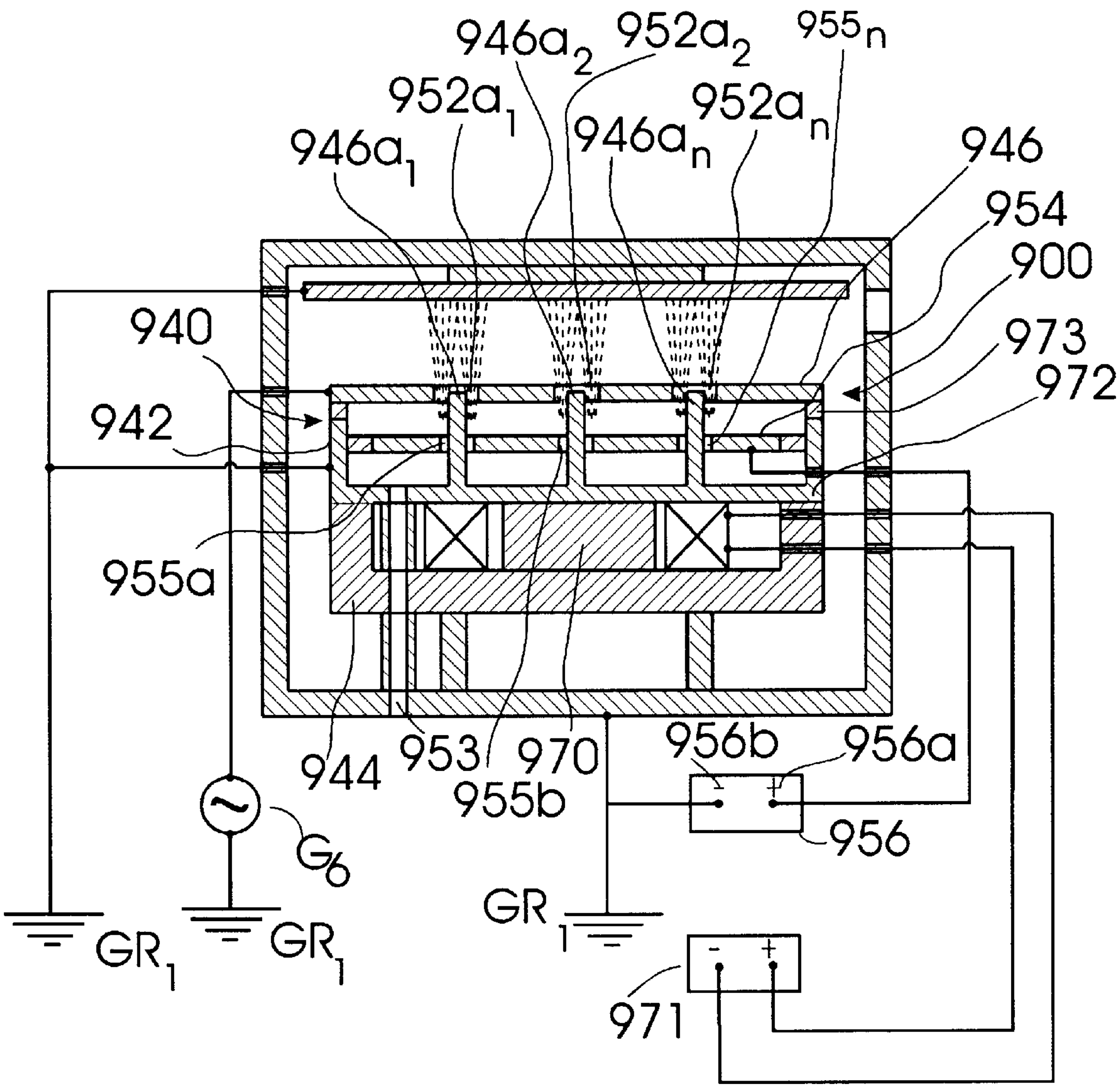
FIG. 15 is a sectional view of an ion source of the invention with a plurality of ion-emitting slits distributed over the upper cathode.

FIG. 15 shows an embodiment of an source 900 with a plurality of ion-emitting slits $952a_1$, $952a_2$ . . . $952a_n$ which are distributed over an upper cathode plate 946. In general, ion-beam source is similar to ion source 100 of FIG. 5 in that it has a housing or cathode 940 with a side wall 942 and a bottom plate 944 with an working gas supply opening 953. Housing 940 contains an anode 954, and a direct current source 956 with a positive terminal 956*a* connected to anode 954 and a negative terminal 956*b* connected to upper cathode plate 946. Negative terminal 956*b* also is grounded at $GR_l$. Upper cathode plate 946 is isolated from the remaining part of housing 940 by means of an insulating plate 973. The aforementioned remaining part of housing 940 is grounded.

In distinction from the embodiment of FIG. 5, anode 954 has a plurality of through openings 955*a*, 955*b* . . . 955*n* for insertion of a plurality of cathode projections 946*a*$_1$, 946*a*$_2$ . . . 946*a*$_n$. Aforementioned ion-emitting slits 952*a*$_1$, 952*a*$_2$ . . . 952*a*$_n$ are formed between the inner walls of openings formed in upper cathode plate 946 and the outer surfaces of aforementioned projections 946*a*$_1$, 946*a*$_2$ . . . 946*a*$_n$.

A source of an electromagnetic field is shown as an electromagnetic coil 970, which is fed from a power source 971 and which is placed inside housing 940 between bottom plate 944 and a plate 972 which functions as a part of a magnetoconductive system. It is understood that the source of the electromagnetic field may be a permanent magnet as well.

Ion source 900 has an additional power source $G_6$ one end of which is connected to upper cathode plate 946. The other end of power source $G_6$ is grounded. Similar to previous embodiments of the invention, additional power source $G_6$ can be an alternating or pulsating voltage source.

During operation of ion-beam source 900, each cell which is formed by a projection, e.g., 946*a*$_1$ with slit 952*a*$_1$, functions in the same manner as in the previous embodiments of the ion sources with the additional power source in the form of an alternating, pulsating, or D.C. voltage source. However, since the cells and hence ion-emitting slits 952*a*$_1$, 952*a*$_2$ . . . 952*a*$_n$ are distributed, preferably uniformly, over upper cathode plate 946, it becomes possible to ensure a uniform distribution ion current density on the surface of the object. If necessary, the cells may have a special pattern of distribution over upper cathode plate 946 for obtaining a predetermined distribution of ion beam current density over the surface of the object.

Figure 16:
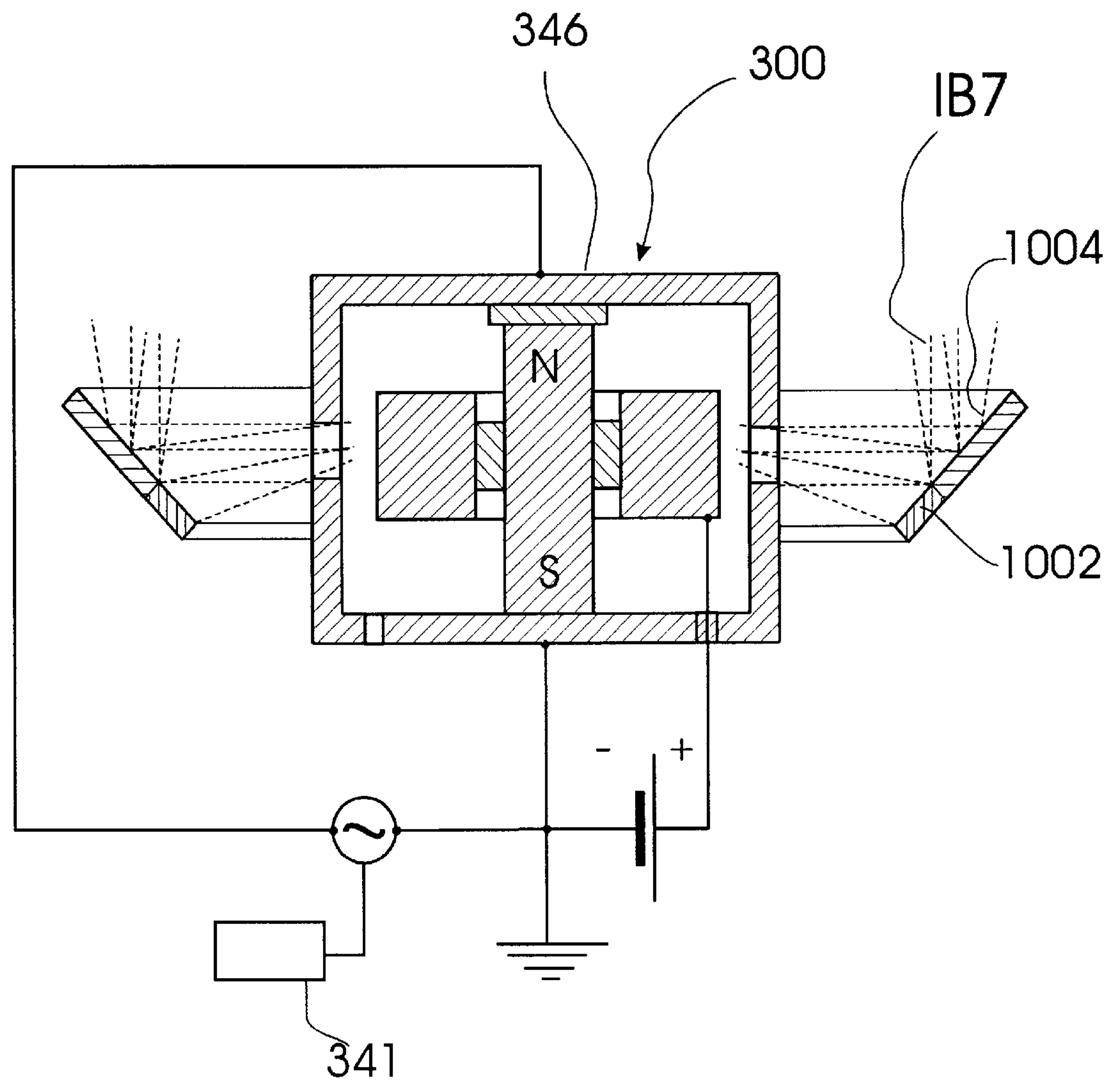
FIG. 16 is a schematic view that shows a combination of the ion source of the invention with a plurality of sputtering targets of different materials for obtaining coating films of controllable composition.

FIG. 16 shows a combination of ion source 300 of FIG. 9 with a plurality of sputtering targets of different materials for obtaining coating films of controllable composition. Only two such targets 1002 and 1004 are shown in FIG. 16, though more than two targets of different materials can be used. The combination of ion source 300 with a plurality of targets is advantageous because, by scanning targets 1002 and 1004 with an ion beam $IB_7$ and by replacing the targets, it becomes possible to change the composition of ions in ion beam $IB_7$ and thus in the film deposited onto the object (not shown).

Figure 17:
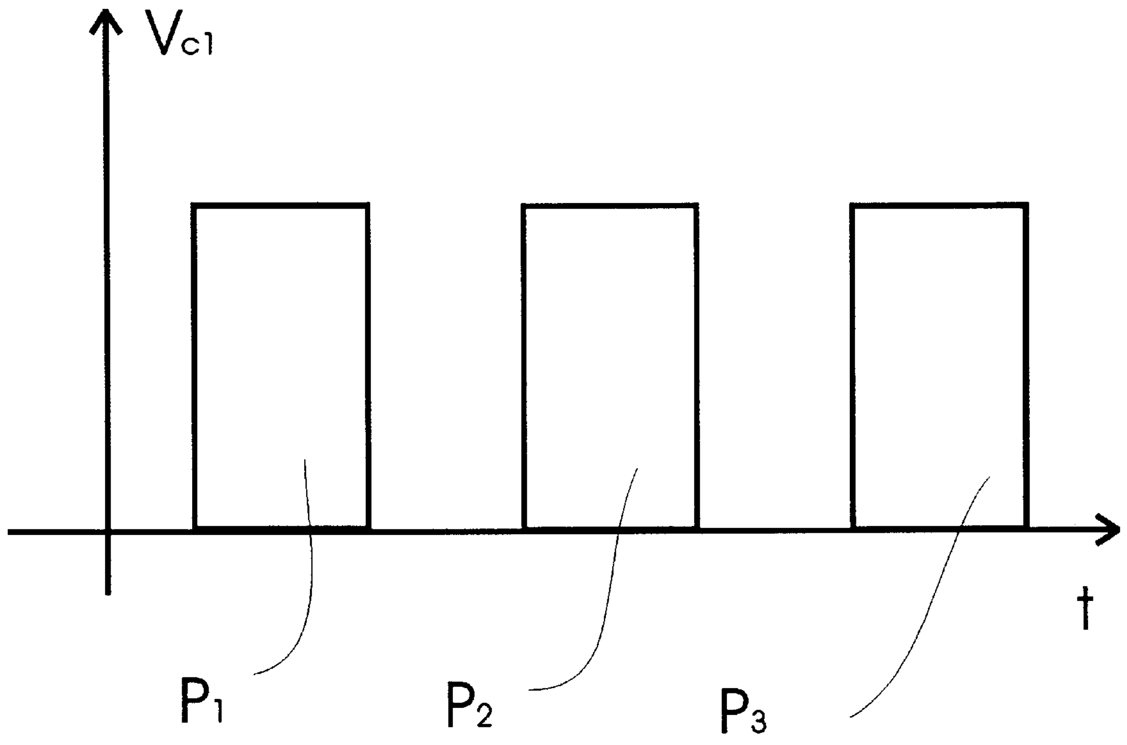
FIG. 17 shows a waveform of a pulsating voltage applied to the upper cathode part of the ion source of FIG. 16.

FIG. 17 shows a waveform of a pulsating voltage applied to upper cathode part 346 of ion source 300. As can be seen from FIG. 17, the application of pulsating voltage signals makes it possible to control the residence time, e.g., by means of a programmable controller 341 (FIG. 16). In other words, in an interval of time between pulses P1, P2, P3 . . . the ion beam may sputter only one target, i.e., 1004, and during the pulses both targets 1002 and 1004 are sputtered.

Thus it has been shown that the invention provides a cold-cathode ion source with a closed-loop configuration of the ion emitting slit which allows for uniform ion beam treatment, with uniformity in the ion current density distribution purely due to the use of electrical means without the use of mechanically moveable parts, and with uniform treatment of the object. The device of the invention is simple in construction and inexpensive to manufacture. The invention also provides a method for improving uniformity of the ion current density on the surfaces of treated objects and makes it possible to adjust the composition of the ion beam purely with electrical means.

Although the invention was shown and described with reference to specific embodiments having specific materials and shapes of the parts and units of the apparatus, it is understood that these embodiments were given only as examples and that any modifications and changes are possible, provided they do not depart from the scope of the patent claims attached below.

For example, the ion source may consist of a plurality of units having a common cathode in conjunction with a plurality of anode, or vice verse. The cathode, anode, and the emitting slit may have different configurations in a cross-sectional view. Such ion sources are disclosed, e.g., in U.S. patent application Ser. No. 09/109684 filed by the same applicants on Jul. 2, 1998. The waveforms of alternating voltages applied ion-emitting slits, electromagnetic coils, anode-cathode ion accelerating spaces, etc. may have forms and frequencies different from those shown in the drawings. For example, these may be rectangular pulses, triangular pulses. The frequency may vary from a few Hz to several kHz and higher. In ion source 400 of FIG. 10, generator $G_3$ can be connected between the ground and a negative terminal of a high-voltage D.C. source.

We claim:

1. A method for controlling position of an ion beam on the surface of an object to be treated with said ion beam, comprising:

providing a cold-cathode ion source with crossed electrical and magnetic fields and with at least one ion-emitting slit, said ion source having a voltage source, an anode connected to a positive potential of said voltage source; and a cathode which comprises at least two parts which are electrically isolated from each other and form said ion-emitting slit; at least one of said two parts being connected to said voltage source;

activating said ion source and generating an ion beam which is emitted through said at least one ion-emitting slit toward said object, said ion beam being charged positively with respect to said at least one part of said cathode which is connected to said voltage source;

applying a potential to said at least one part of said cathode from said voltage source for generating an electric field across said at least one ion-emitting slit;

acting by said electric field onto said ion beam; and deviating said ion beam in a direction transverse to said direction of said ion beam.

2. The method of claim 1, wherein said voltage source is an alternating voltage source having a voltage pulse with a positive half-wave and a negative halve wave, said electric field being generated only during said positive half-wave of said voltage pulse.

3. A method of claim 1, wherein said voltage source comprises:

a main voltage source having a main positive terminal and a main negative terminal, said main positive terminal of said first voltage source being connected to said anode; an additional voltage source having an additional positive terminal and an additional negative terminal; said at least two parts of said cathode being electrically isolated from one another, at least one of said two parts being connected to said additional power source;

said ion beam being charged positively by said main voltage source with respect to said at least one part of said cathode which is connected to said additional voltage source;

said additional voltage source generating an additional electric field across said at least one ion-emitting slit;

said step of acting onto said ion beam being performed by said additional electric field.

4. The method of claim 3, wherein said additional voltage source is a direct current voltage source having a negative terminal and a positive terminal and wherein said at least one part of said cathode is connected to said positive terminal, while another of said at least two parts of said cathode is grounded, said step of deviating said ion beam comprising alternating said connection of said at least one part of said cathode between ground and said positive terminal.

5. The method of claim 4, wherein said additional voltage source is a direct current voltage source having a negative terminal and a positive terminal and wherein said at least one part of said cathode is connected to said positive terminal, while another of said at least two parts of said cathode is grounded, said step of deviating said ion beam comprising varying the magnitude of a direct current voltage applied from said direct current voltage source to said at least one part of said cathode.

6. The method of claim 4, wherein said at least one part of said cathode surrounds said another part of said at least two parts with the formation of at least one outer part of said cathode, at least one inner part of said cathode, and said at least one ion-emitting slit between said at least one outer part and said at least one inner part of said cathode.

7. The method of claim 6, wherein said at least one outer part is connected to said positive terminal of said additional ion source, while said inner part is grounded.

8. The method of claim 6, wherein said at least one outer part of said cathode has at least one opening said at least one inner part having at least one projection inserted into said at least one opening with the formation of said at least one ion-emitting slit between said at least one opening and said at least one projection.

9. The method of claim 8, wherein said cold-cathode ion source has a plurality of said openings, said projections, and said ion-emitting slits.

10. The method of claim 3, wherein said additional voltage source is a variable-voltage generator and wherein said step of alternating said connection of said at least one part of said cathode between said negative and positive terminals is performed by means of said alternating current voltage generator.

11. The method of claim 10, wherein said additional electric field is a cyclically variable field which is generated by said variable-voltage generator.

12. The method of claim 11, further comprising the steps of:

placing at least one target of a sputterable material on the path of said ion beam towards said object at an angle to said beam for sputtering said sputterable material of said at least one target onto said object; and performing said step of deviating said ion beam by means of said cyclically variable field.

13. The method of claim 12, wherein a plurality of targets of different sputterable materials are used, and wherein in said step of deviating said ion beam scans said plurality of targets with controlled residence time on said different sputterable materials.

14. An ion beam source with a closed-loop ion-emitting slit capable of emitting an ion beam toward an object located in a position reachable by said ion beam, comprising:

a hollow housing that functions as a cathode of said ion beam source;

anode located in said hollow housing and spaced from said cathode to form an ion acceleration and ionization space therebetween for ionization and acceleration of ions formed in said space during operation of said ion beam source;

magnetic field generating means in a magnetoconductive relationship with said anode and said cathode for forming a closed magnetoconductive circuit passing through said anode, said ionization gap, said cathode, and said magnetic field generating means;

said cathode having, on the side hollow housing facing said object, a first part and a second which are spaced from each other to form said closed-loop ion-emitting slit therebetween, said closed-loop ion-emitting slit being in the path of said magnetoconductive circuit;

electric power supply means for applying a positive charge to said anode;

means for generating a cyclically variable field acting on said ion beam on the path of emission of said beam from said ion source and capable of deviating said beam in the direction transverse to the direction of propagation of said beam with a frequency of said variable field; and means for the supply of a working medium into said hollow housing of said cathode to form an ion beam when said working medium passes through said acceleration and ionization gap.

15. The ion source of claim 14, wherein said means for generating a cyclically variable field comprises an alternating voltage generator one end of which is grounded and is electrically connected to said hollow housing of said cathode and another end is electrically connected to one of said first and second parts of said cathode, said cyclically variable field being an electric field.

16. The ion source of claim 14, wherein said means for generating cyclically variable field comprises an alternating voltage generator, said first part of said cathode surrounding said second part and being grounded, said second part being connected to one side of said alternating voltage generator, whereas the other side of said alternating voltage generator being grounded; said electric power supply means being a direct current electric power source which has a positive side and a negative side, said positive side being connected to said anode, said cyclically variable field being an electric field.

17. The ion source of claim 14, wherein said means for generating cyclically variable field comprises an alternating voltage generator, said first part of said cathode surrounding said second part and being connected to one side of said alternating voltage generator, said second part being grounded; said electric power supply means being a direct current electric power source which has a positive side and a negative side, said positive side being connected to said anode, said cyclically variable field being an electric field.

18. The ion source of claim 14, wherein the direction of drift of electrons coincides with the direction of said ion beam, said means for generating a cyclically variable field is an alternating voltage generator one side of which is connected to one of said first and second parts of said cathode whereas the other side of said alternating voltage generator is grounded, said first and second parts of said cathode being electrically isolated from one another.

19. A cold-cathode ion source with crossed electrical and magnetic fields and with at least one ion-emitting slit, said ion source having a first voltage source, an anode connected to a positive potential of said first voltage source, an additional voltage source, and a cathode which comprises of at least two parts which are electrically isolated from one another, at least one of said two parts being connected to said additional voltage source.

20. The ion source of claim 19, wherein said additional voltage source is a direct current voltage source having a negative terminal and a positive terminal and wherein said at least one part of said cathode is connected to said positive terminals, while another of said at least two parts of said cathode is grounded, said additional voltage source having means for switching connections of said additional voltage source between ground and said at least one part of said cathode.

21. The ion source of claim 20, wherein said additional voltage source is a direct current voltage source having a negative terminal and a positive terminal and wherein said at least one part of said cathode is connected to said positive terminal, while another of said at least two parts of said cathode is grounded, said additional direct current voltage source having means for varying the magnitude of a direct current voltage applied from said direct current voltage source to said at least one part of said cathode.

22. The ion source of claim 19, wherein said at least one part of said cathode surrounds said another part of said at least two parts with the formation of at least one outer part of said cathode, at least one inner part of said cathode, and said at least one ion-emitting slit between said at least one outer part and said at least one inner part of said cathode.

23. The ion source of claim 22, wherein said at least one outer part is connected to said positive terminal of said additional ion source, while said inner part is grounded.

24. The ion source of claim 22 wherein said at least one outer part of said cathode has at least one opening, said at least one inner part having at least one projection inserted into said at least one opening with the formation of said at least one ion-emitting slit between said at least one opening and said at least one projection.

25. The ion source of claim 24, wherein said cold-cathode ion source has a plurality of said openings, said projections, and said ion-emitting slits.

26. The ion source of claim 20, wherein said additional voltage source is a variable-voltage generator.

27. The ion source of claim 19, further comprising at least one target of a sputterable material on the path of said ion beam towards said object at an angle to said beam for sputtering said sputterable material of said at least one target onto said object.

28. The ion source of claim 27, having a plurality of targets of different sputterable materials, said additional voltage source having means for adjusting the residence time of said ion beam on said different sputterable materials.

* * * * *